United States Patent
Kerrigan et al.

(10) Patent No.: US 10,544,506 B2
(45) Date of Patent: Jan. 28, 2020

(54) METHOD OF FORMING A SILICON NITRIDE FILM USING SI—N CONTAINING PRECURSORS

(71) Applicant: Air Liquide Advanced Materials, LLC, Branchburg, PA (US)

(72) Inventors: Sean Kerrigan, Princeton, NJ (US); Antonio Sanchez, Tsukuba (JP)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 11 days.

(21) Appl. No.: 15/560,635

(22) PCT Filed: Mar. 30, 2016

(86) PCT No.: PCT/US2016/025011
§ 371 (c)(1),
(2) Date: Sep. 22, 2017

(87) PCT Pub. No.: WO2016/160991
PCT Pub. Date: Oct. 6, 2016

(65) Prior Publication Data
US 2018/0087150 A1   Mar. 29, 2018

Related U.S. Application Data

(60) Provisional application No. 62/140,415, filed on Mar. 30, 2015.

(51) Int. Cl.
*C23C 16/34* (2006.01)
*C23C 16/455* (2006.01)
(Continued)

(52) U.S. Cl.
CPC ...... *C23C 16/345* (2013.01); *C23C 16/45525* (2013.01); *C23C 16/50* (2013.01);
(Continued)

(58) Field of Classification Search
CPC .............................. C23C 16/34; C23C 16/345
See application file for complete search history.

(56) References Cited

U.S. PATENT DOCUMENTS 4,883,107 A    5/1989  Kaya et al.
5,234,869 A *  8/1993  Mikata .................. C23C 16/345
                                              148/DIG. 114
(Continued)

FOREIGN PATENT DOCUMENTS

CN    103881101      6/2014
EP    1 640 404      3/2006
(Continued)

OTHER PUBLICATIONS

Ziegler and Fearon, ed., Silicon-Based Polymer Science, Advances in Chemistry; American Chemical Society: Washington, DC, 1989, Chapter 33, pp. 607-618.*
(Continued)

*Primary Examiner* — Bret P Chen
(74) *Attorney, Agent, or Firm* — Patricia E. McQueeney; Allen E. White

(57) ABSTRACT

Methods for forming a SiN-containing film are disclosed. The methods use film-forming compositions comprising Si—N containing precursors. Also disclosed are methods of synthesizing the same and methods of using the same for vapor deposition. In particular, a catalytic dehydrogenative coupling of carbosilanes with ammonia, amines and amidines produces the Si—N containing precursors.

12 Claims, 1 Drawing Sheet

(51) Int. Cl.
 C23C 16/50 (2006.01)
 H01L 21/02 (2006.01)
(52) U.S. Cl.
 CPC ...... H01L 21/0217 (2013.01); H01L 21/0228 (2013.01); H01L 21/02222 (2013.01); H01L 21/02274 (2013.01)

(56) References Cited

U.S. PATENT DOCUMENTS

| | | | |
|---|---|---|---|
| 6,489,030 B1 | 12/2002 | Wu et al. | |
| 6,940,173 B2 | 9/2005 | Cohen et al. | |
| 8,129,555 B2* | 3/2012 | Cheng | C23C 16/345 257/E21.269 |
| 8,497,391 B2 | 7/2013 | Ohno et al. | |
| 2003/0017635 A1 | 1/2003 | Apen et al. | |
| 2005/0080285 A1 | 4/2005 | Wang et al. | |
| 2006/0012014 A1 | 1/2006 | Chen et al. | |
| 2006/0228903 A1* | 10/2006 | McSwiney | C23C 16/308 438/778 |
| 2007/0275166 A1 | 11/2007 | Thridandam et al. | |
| 2008/0058541 A1 | 3/2008 | Bowen et al. | |
| 2008/0124815 A1 | 5/2008 | Malone et al. | |
| 2009/0061199 A1 | 3/2009 | Egami et al. | |
| 2010/0034789 A1 | 2/2010 | De La Mata De La Mata et al. | |
| 2010/0252917 A1 | 10/2010 | Karkkainen | |
| 2013/0065404 A1* | 3/2013 | Weidman | C23C 16/325 438/786 |
| 2013/0078376 A1* | 3/2013 | Higashino | C23C 16/34 427/255.39 |
| 2014/0017892 A1* | 1/2014 | Ward | H01L 21/31116 438/693 |
| 2014/0030448 A1 | 1/2014 | Bowen et al. | |
| 2014/0051264 A1 | 2/2014 | Mallick et al. | |
| 2014/0158580 A1 | 6/2014 | Xiao et al. | |
| 2015/0024608 A1 | 1/2015 | Mayorga et al. | |
| 2015/0087139 A1* | 3/2015 | O'Neill | C23C 16/24 438/482 |
| 2015/0147484 A1 | 5/2015 | Nguyen et al. | |
| 2015/0246937 A1 | 9/2015 | Xiao et al. | |
| 2017/0291915 A1* | 10/2017 | Fafard | C23C 16/36 |
| 2017/0338109 A1* | 11/2017 | Lei | C23C 16/36 |
| 2018/0023192 A1* | 1/2018 | Chandra | C23C 16/345 438/760 |
| 2018/0199432 A1* | 7/2018 | Thompson | H01L 21/0228 |

FOREIGN PATENT DOCUMENTS

| | | |
|---|---|---|
| EP | 2 048 700 | 4/2009 |
| EP | 2 818 474 | 12/2014 |
| JP | 62-108719 | * 5/1987 |
| JP | 2002 167438 | 6/2002 |
| JP | 4196246 | 12/2008 |
| KR | 2014 0087908 | 7/2014 |
| WO | WO 2004 030071 | 4/2004 |
| WO | WO 2005 045899 | 5/2005 |
| WO | WO 2005 093126 | 10/2005 |
| WO | WO 2009 087609 | 7/2009 |
| WO | WO 2011 123792 | 10/2011 |
| WO | WO 2016 049154 | 3/2016 |
| WO | WO 2017 165626 | 9/2017 |

OTHER PUBLICATIONS

Cheng, Huijie, et al., "In situ synthesis of Si2N2O/Si3N4 composite ceramics using polysilyloxycarbodiimide precursors". Journal of the European Ceramic Society 33 (2013) 2181-2189.*
Cianci, E., et al., "Analysis of stress and composition of silicon nitride thin films deposited by . . . ". J. Vac. Sci. Technol. B 23(1), Jan./Feb. 2005, pp. 168-172.*
Pettersson, M., et al., "Structure and composition of silicon nitride and silicon carbon nitride coatings for joint replacements". Surface and Coatings Technology 235 (2013) 827-834.*
Aylett, B.J. et al., "The preparation and some properties of disilylamine," Inorg. Chem. 1966 5(1) 167.
Blandez, J.F. et al., "Palladium nanoparticles supported on graphene as catalysts for the dehydrogenative coupling of hydrosilanes and amines," Catal. Sci. Technol. 2015 (5) 1969, 2167-2173.
Elsässer, R. et al., "Nematic dendrimers based on carbosilazane cores" Angewandte Chemie Int. Ed., vol. 40, issue 14, Jul. 16, 2001, 2688-2690.
Guruvenket, S. et al., "Atmospheric-pressure plasma-enhanced chemical vapor deposition of a-SiCN-H films: role of precursors on the film growth and properties," ACS Applied Materials and Interfaces 2012, 4, 5293-5299.
Hizawa et al., "Synthesis of alkyl and alkoxy derivatives of hexachlorodisihnethylene and their hydrolysis," The Journal of the Society of Chemical Industry, Japan, vol. 59 (1956) No. 11 p. 1359-1363.
Hvolbaek, B. et al., "Catalytic activity of Au nanoparticles," Nanotoday, Aug. 2007, vol. 2, No. 4, 14-156.
Jansen, M. et al., "Preparation and characterization of the carbosilazanes bis[tris(methylamino)silyl]methane and bis[tris(phenylamino)silyl]methane," Z. Naturforsch. 52 b, 707-710 (1997).
Lin, C. et al., "Size effect of gold nanoparticles in catalytic reduction of p-nitrophenol with NaBH4," Molecules 2013, 18, 12609-12620.
Liu, H.Q. et al., "Dehydrocoupling of ammonia and silanes catalyzed by dimethyltitanocene," Organometallics 1992, 11, 822-827.
Mitzel, N.W. et al., "Synthesis of volatile cyclic silylamines and the molecular structures of two 1-aza-2,5-disilacyclopenane derivatives," Inorg. Chem. 1997, 36, 4360-4368.
Morrison, J.A. et al., "Synthesis and characterization of the (halosilyl)methylsilanes," Journal of Organometallic Chemistry, 91 (1975) 163-168.
Passarelli, V. et al., "Aminolysis of the Si—Cl bond and ligand exchange reaction between silicon amido derivatives and $SiCl_4$: synthetic applications and kinetic investigations," Dalton Transl 2003, 413-419.
Ringleb, F. et al., "Preparation of Pd—MgO model catalysts by deposition of Pd from aqueous precursor solutions onto Ag(001)-supported MgO(001) thin films," Applied Catalysis A: General 474 (2014) 186-193.
Schmidbauer, H. et al., "Differences in reactivity of 1,4-disilabutane and n-tetrasilane towards secondary amines," Z. Naturforsch. 45b, 1990, 1679-1863.
Schuh, H. et al., "Disilanyl-amines—compounds comprising the structural unit Si—Si—N, as single-source precursors for plasma-enhanced chemical vapour deposition (PE-CVD) of silicon nitride," Z. Anorg. Allg. Chem. 619 (1993) 1347-1352.
Shatnawi, M. et al., "Formation of Si—C—N ceramics from melamine-carbosilazane single source precursors," Journal of Solid State Chemistry, vol. 181, issue 1, Jan. 2008, 150-157.
Topchiev, A.B. et al., "Synthesis of compounds with silazine links," Doklady Akademii Nauk SSSR, 1956,109, 787-90.
Topchiev, A.B. et al., Issled. v Obl. Kremniiorgan. Soedin., Sintez i Fiz.-Khim. Svoistva, Akad. Nauk SSSR, Inst. Neftekhim. Sinteza, Sb. Statei, 1962, 130-45.
Xie, W. et al., "[(NHC)Yb{N(SiMe3)2}2]-catalyzed cross-dehydrogenative coupling of silanes with amines," Angew. Chem. Int. Ed. 2012, 51, 11141-11144 and Angew. Chem. 2012 124 11303-11306, DOI: 10.1002/ange.201205317.
International Search Report and Written Opinion for corresponding PCT/US2015/051678, dated Jan. 7, 2016.
International Search Report and Written Opinion for related PCT/US2016/025011, dated Jul. 7, 2016.
Warren, T.K et al., "Protection Against Filovirus Diseases by a Novel Broad-Spectrum Nucleoside Analogue BCX4430," Nature, vol. 508, Apr. 17, 2014, 402-411.
International Search Report and Written Opinion for corresponding PCT/US2017/023779, dated Jun. 6, 2017.

* cited by examiner

METHOD OF FORMING A SILICON NITRIDE FILM USING SI—N CONTAINING PRECURSORS

CROSS REFERENCE TO RELATED APPLICATIONS

The present application is a 371 of International PCT Application PCT/US2016/025011, filed Mar. 30, 2016, which claims priority to U.S. Provisional Application Ser. No. 62/140,415 filed Mar. 30, 2015, being herein incorporated by reference in its entirety for all purposes.

TECHNICAL FIELD

Disclosed are Si-containing film forming compositions comprising Si—N containing precursors, methods of synthesizing the same, and methods of using the same for vapor deposition. In particular, a catalytic dehydrogenative coupling of carbosilanes with ammonia, amines and amidines produces the Si—N containing precursors.

BACKGROUND

Precursors having a Si—N bond, such as silylamines, have been synthesized through reactions of chlorosilanes with amines or ammonia in the presence of bases ("Disilanylamines. Compounds comprising the structural unit silicon-silicon-nitrogen, as single-source precursors for plasma-enhanced chemical vapor deposition (PE-CVD) of silicon nitride" Schuh, H.; Schlosser, T.; Bissinger, P.; Schmidbaur, H. *Zeitschrift fuer Anorganische and Allgemeine Chemie* 1993, 619(8), 1347-1352). This type of reaction, however, may not be desirable both in terms of the toxicity and relative instability of chlorosilanes and also because large amounts of ammonium halides may be generated as by-products ("Aminolysis of the Si—Cl bond and ligand exchange reaction between silicon amido derivatives and SiCl4: synthetic applications and kinetic investigations" Passarelli, V.; Carta, G.; Rossetto, G.; Zanella, P. Dalton Trans. 2003, (3), 413-419). Furthermore, since substrates on which the precursors will be deposited need to be compatible with base, a further disadvantage of this traditional approach may also have this limitation to the substrates.

Dehydrogenative coupling reactions of silanes and N-containing molecules may produce chloride-free and base-free Si—N containing compounds. Harrod et al. ("Dehydrocoupling of Ammonia and Silanes", Liu, H. Q.; Harrod, J. F. Organometallics (1992), 11, p822-827) disclosed that dimethyltitanocene was used as a catalyst for the dehydrocoupling of ammonia with two different phenylsilanes. More recently, Cui et al. ("[(NHC)Yb{N(SiMe$_3$)$_2$}$_2$]-Catalyzed Cross-Dehydrogenative Coupling of Silanes with Amines", Xie, W.; Hu, H.; Cui, C. Angewandte (2012), 124, p 11303-11306) described dehydrogenative coupling of aromatic silanes and amines catalyzed by an Ytterbium based catalyst. In 2015, dehydrogenative coupling of hydosilanes with amines was described by Mitsudome et al. ("Palladium nanoparticles supported on graphene as catalysts for the dehydrogenative coupling of hydrosilanes and amines", Garcia et al. *Catal. Sci. Tecticnol.*2015, 5(3), 1969).

Si—N containing compounds such as (Et$_2$N)$_2$SiHCH$_2$CH$_2$SiH$_3$, (Et$_2$N)$_2$SiHCH$_2$CH$_2$SiH$_2$(NEt$_2$), and (Et$_2$N)$_2$SiHCH$_2$CH$_2$SiH(NEt$_2$)$_2$ were produced by Schmidbaur et al. ("Differences in Reactivity of 1,4-Disilabutane and n-Tetrasilane towards Secondary Amines", Hubert Schmidbaur and Heinz Schuh, Z. Naturforsch (1990), 45b, 1679-1863) by reacting 1,4-disilabutane H$_3$Si(CH$_2$)$_2$SiH$_3$ and n-tetrasilane H$_3$SiSiH$_2$SiH$_2$SiH$_3$ with the appropriate equivalents of diethylamine in an alkane solvent and in the presence of the two-phase catalyst NaNH$_2$/18-crown-6.

US2015/087139 to Air Products discloses an organoaminosilane compound having the formula (R$^1$R$^2$N)$_n$—SiH$_{3-n}$—R$^3$—SiH$_{3-m}$(NR$^1$R$^2$)$_m$.

There exists a need for Si—N dehydrocoupling precursors suitable for chloride-free and base-free vapor depositions to form films with desirable electrical and physical properties.

SUMMARY

Disclosed are Si-containing film forming compositions comprising a Si—N containing precursor. The Si—N containing precursor has the following formula:

R$^1$R$^2$N—SiHR$^3$—(CH$_2$)$_n$—SiH$_2$R$^4$ wherein n=1 or 2; R$^1$ and R$^2$ may independently be H, a C$_1$ to C$_6$ alkyl group, or a C$_3$-C$_{20}$ aryl, heterocycle or cycloalkyl group; R$^3$ and R$^4$ may independently be H; an amino group [—NRR'] with R and R' each independently being H, a C$_1$ to C$_6$ alkyl group; a C$_3$-C$_{20}$ aryl, heterocycle or cycloalkyl group; or an amidinate group having the formula —N(R)C(Me)=NR' group with R and R' independently being H, a C$_1$ to C$_6$ alkyl group, or a C$_3$-C$_{20}$ aryl, heterocycle or cycloalkyl group; provided that when n=2, R$^1$=R$^2$≠Et, R$^3$≠NEt$_2$, R$^4$≠H or NEt$_2$. The disclosed Si-containing film forming compositions may have one or more of the following aspects:

- The C$_3$-C$_{20}$ aryl, heterocycle or cycloalkyl group being —SiH$_2$—(CH$_2$)$_n$—SiH$_3$, —SiH$_2$—(CH$_2$)$_n$—SiH$_2$—NH—SiH$_2$—(CH$_2$)$_n$—SiH$_3$, —NH—SiH$_2$—(CH$_2$)$_n$—SiH$_3$, or —C(Me)=NR group, wherein R may independently be H, a C$_1$ to C$_6$ alkyl group, or a C$_3$-C$_{20}$ aryl, heterocycle or cycloalkyl group;
- R$^1$ and R$^2$ may independently be H; a C$_1$ to C$_6$ alkyl group; a C$_3$-C$_{20}$ aryl, heterocycle or cycloalkyl group; —SiH$_2$—(CH$_2$)$_n$—SiH$_3$; —SiH$_2$—(CH$_2$)$_n$—SiH$_2$—NH—SiH$_2$—(CH$_2$)$_n$—SiH$_3$; NH—SiH$_2$—(CH$_2$)$_n$—SiH$_3$; or —C(Me)=NR, wherein R may independently be H, a C$_1$ to C$_6$ alkyl group, or a C$_3$-C$_{20}$ aryl, heterocycle or cycloalkyl group;
- R$^1$=SiH$_2$—(CH$_2$)$_n$—SiH$_3$;
- R$^2$=R$^3$=R$^4$=H;
- The Si—N containing precursor having the formula:

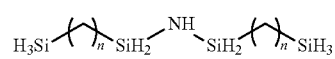

- The Si—N containing precursor having the formula H$_3$Si—CH$_2$—SiH$_2$—NH—SiH$_2$—CH$_2$—SiH$_3$;
- The Si—N containing precursor having the formula H$_3$Si—CH$_2$—CH$_2$—SiH$_2$—NH—SiH$_2$—CH$_2$—CH$_2$—SiH$_3$;
- R$^1$=R$^2$=SiH$_2$—(CH$_2$)$_n$—SiH$_3$;
- R$^3$=R$^4$=H;
- the Si—N containing precursor having the formula:

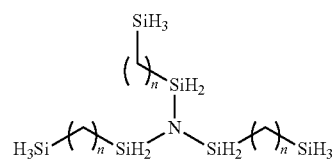

The Si—N containing precursor being N—(SiH$_2$—CH$_2$—SiH$_3$)$_3$;
The Si—N containing precursor being N—(SiH$_2$—CH$_2$—CH$_2$—SiH$_3$)$_3$;
the Si—N containing precursor being N(SiH(NH$_2$)—CH$_2$—SiH$_3$)$_3$;
the Si—N containing precursor being N(SiH(NMe$_2$)—CH$_2$—SiH$_3$)$_3$;
the Si—N containing precursor being N(SiH(NMeEt)—CH$_2$—SiH$_3$)$_3$;
the Si—N containing precursor being N(SiH(NEt$_2$)—CH$_2$—SiH$_3$)$_3$;
the Si—N containing precursor being N(SiH(NnPr$_2$)—CH$_2$—SiH$_3$)$_3$;
the Si—N containing precursor being N(SiH(NiPr$_2$)—CH$_2$—SiH$_3$)$_3$;
the Si—N containing precursor being N(SiH(NBu$_2$)—CH$_2$—SiH$_3$)$_3$;
the Si—N containing precursor being N(SiH(NiBu$_2$)—CH$_2$—SiH$_3$)$_3$;
the Si—N containing precursor being N(SiH(NtBu$_2$)—CH$_2$—SiH$_3$)$_3$;
the Si—N containing precursor being N(SiH(NAm$_2$)—CH$_2$—SiH$_3$)$_3$;
the Si—N containing precursor being N(SiH(NCyPentyl$_2$)—CH$_2$—SiH$_3$)$_3$;
the Si—N containing precursor being N(SiH(Nhexyl$_2$)-CH$_2$—SiH$_3$)$_3$;
the Si—N containing precursor being N(SiH(NCyHex$_2$)-CH$_2$—SiH$_3$)$_3$;
the Si—N containing precursor being N(SiH(NMeH)—CH$_2$—SiH$_3$)$_3$;
the Si—N containing precursor being N(SiH(NEtH)—CH$_2$—SiH$_3$)$_3$;
the Si—N containing precursor being N(SiH(NnPrH)—CH$_2$—SiH$_3$)$_3$;
the Si—N containing precursor being N(SiH(NiPrH)—CH$_2$—SiH$_3$)$_3$;
the Si—N containing precursor being N(SiH(NBuH)—CH$_2$—SiH$_3$)$_3$;
the Si—N containing precursor being N(SiH(NiBuH)—CH$_2$—SiH$_3$)$_3$;
the Si—N containing precursor being N(SiH(NtBuH)—CH$_2$—SiH$_3$)$_3$;
the Si—N containing precursor being N(SiH(NAmH)—CH$_2$—SiH$_3$)$_3$;
the Si—N containing precursor being N(SiH(pyridine)-CH$_2$—SiH$_3$)$_3$;
the Si—N containing precursor being N(SiH(pyrrole)-CH$_2$—SiH$_3$)$_3$;
the Si—N containing precursor being N(SiH(pyrrolidine)-CH$_2$—SiH$_3$)$_3$;
the Si—N containing precursor being N(SiH(imidazole)-CH$_2$—SiH$_3$)$_3$;
the Si—N containing precursor being N(SiH(piperidine)-CH$_2$—SiH$_3$)$_3$;
the Si—N containing precursor being N(SiH(pyrimidine)-CH$_2$—SiFl$_3$)$_3$;
the Si—N containing precursor being N(SiH$_2$—CH$_2$—SiH$_2$(NH$_2$))$_3$;
the Si—N containing precursor being N(SiH$_2$—CH$_2$—SiH$_2$(NMe$_2$))$_3$;
the Si—N containing precursor being N(SiH$_2$—CH$_2$—SiH$_2$(NMeEt))$_3$;
the Si—N containing precursor being N(SiH$_2$—CH$_2$—SiH$_2$(NEt$_2$))$_3$;
the Si—N containing precursor being N(SiH$_2$—CH$_2$—SiH$_2$(NnPr$_2$))$_3$;
the Si—N containing precursor being N(SiH$_2$—CH$_2$—SiH$_2$(NiPr$_2$))$_3$;
the Si—N containing precursor being N(SiH$_2$—CH$_2$—SiH$_2$(NBu$_2$))$_3$;
the Si—N containing precursor being N(SiH$_2$—CH$_2$—SiH$_2$(NiBu$_2$))$_3$;
the Si—N containing precursor being N(SiH$_2$—CH$_2$—SiH$_2$(NtBu$_2$))$_3$;
the Si—N containing precursor being N(SiH$_2$—CH$_2$—SiH$_2$(NAm$_2$))$_3$;
the Si—N containing precursor being N(SiH$_2$—CH$_2$—SiH$_2$(NCyPentyl$_2$))$_3$;
the Si—N containing precursor being N(SiH$_2$—CH$_2$—SiH$_2$(Nhexyl$_2$))$_3$;
the Si—N containing precursor being N(SiH$_2$—CH$_2$—SiH$_2$(NCyHex$_2$))$_3$;
the Si—N containing precursor being N(SiH$_2$—CH$_2$—SiH$_2$(NMeH))$_3$;
the Si—N containing precursor being N(SiH$_2$—CH$_2$—SiH$_2$(NEtH))$_3$;
the Si—N containing precursor being N(SiH$_2$—CH$_2$—SiH$_2$(NnPrH))$_3$;
the Si—N containing precursor being N(SiH$_2$—CH$_2$—SiH$_2$(NiPrH))$_3$;
the Si—N containing precursor being N(SiH$_2$—CH$_2$—SiH$_2$(NBuH))$_3$;
the Si—N containing precursor being N(SiH$_2$—CH$_2$—SiH$_2$(NiBuH))$_3$;
the Si—N containing precursor being N(SiH$_2$—CH$_2$—SiH$_2$(NtBuH))$_3$;
the Si—N containing precursor being N(SiH$_2$—CH$_2$—SiH$_2$(NAmH))$_3$;
the Si—N containing precursor being N(SiH$_2$—CH$_2$—SiH$_2$(pyridine))$_3$;
the Si—N containing precursor being N(SiH$_2$—CH$_2$—SiH$_2$(pyrrole))$_3$;
the Si—N containing precursor being N(SiH$_2$—CH$_2$—SiH$_2$(pyrrolidine))$_3$;
the Si—N containing precursor being N(SiH$_2$—CH$_2$—SiH$_2$(imidazole))$_3$;
the Si—N containing precursor being N(SiH$_2$—CH$_2$—SiH$_2$(pyrimidine))$_3$;
the Si—N containing precursor being N(SiH$_2$—CH$_2$—SiH$_2$(piperidine))$_3$;
the Si—N containing precursor being N(SiH(NH$_2$)—CH$_2$—SiH$_2$(NH$_2$))$_3$;
the Si—N containing precursor being N(SiH(NMe$_2$)—CH$_2$—SiH$_2$(NMe$_2$))$_3$;
the Si—N containing precursor being N(SiH(NMeEt)-CH$_2$—SiH$_2$(NMeEt))$_3$;
the Si—N containing precursor being N(SiH(NEt$_2$)-CH$_2$—SiH$_2$(NEt$_2$))$_3$;
the Si—N containing precursor being N(SiH(NnPr$_2$)—CH$_2$—SiH$_2$(NnPr$_2$))$_3$;
the Si—N containing precursor being N(SiH(NiPr$_2$)—CH$_2$—SiH$_2$(NiPr$_2$))$_3$;
the Si—N containing precursor being N(SiH(NBu$_2$)-CH$_2$—SiH$_2$(NBu$_2$))$_3$;
the Si—N containing precursor being N(SiH(NiBu$_2$)-CH$_2$—SiH$_2$(NiBu$_2$))$_3$;
the Si—N containing precursor being N(SiH(NtBu$_2$)-CH$_2$—SiH$_2$(NtBu$_2$))$_3$;
the Si—N containing precursor being N(SiH(NAm$_2$)-CH$_2$—SiH$_2$(NAm$_2$))$_3$;

the Si—N containing precursor being N(SiH(NCyPentyl₂)-CH₂—SiH₂(NCyPentyl₂))₃;
the Si—N containing precursor being N(SiH(Nhexyl₂)-CH₂—SiH₂(Nhexyl₂))₃;
the Si—N containing precursor being N(SiH(NCyHex₂)-CH₂—SiH₂(NCyHex₂))₃;
the Si—N containing precursor being N(SiH(NMeH)—CH₂—SiH₂(NMeH))₃;
the Si—N containing precursor being N(SiH(NEtH)—CH₂—SiH₂(NEtH))₃;
the Si—N containing precursor being N(SiH(NnPrH)—CH₂—SiH₂(NnPrH))₃;
the Si—N containing precursor being N(SiH(NiPrH)—CH₂—SiH₂(NiPrH))₃;
the Si—N containing precursor being N(SiH(NBuH)—CH₂—SiH₂(NBuH))₃;
the Si—N containing precursor being N(SiH(NiBuH)—CH₂—SiH₂(NiBuH))₃;
the Si—N containing precursor being N(SiH(NtBuH)—CH₂—SiH₂(NtBuH))₃;
the Si—N containing precursor being N(SiH(NAmH)—CH₂—SiH₂(NAmH))₃;
the Si—N containing precursor being N(SiH(pyridine)-CH₂—SiH₂(pyridine))₃;
the Si—N containing precursor being N(SiH(pyrrole)-CH₂—SiH₂(pyrrole))₃;
the Si—N containing precursor being N(SiH(pyrrolidine)-CH₂—SiH₂(pyrrolidine))₃;
the Si—N containing precursor being N(SiH(imidazole)-CH₂—SiH₂(imidazole))₃;
the Si—N containing precursor being N(SiH(piperidine)-CH₂—SiH₂(imidazole))₃;
the Si—N containing precursor being N(SiH(pyrimidine)-CH₂—SiH₂(imidazole))₃;
$R^1=R$;
$R^2=SiH_2—(CH_2)_n—SiH_3$;
$R^3=R^4=H$;
The Si—N containing precursor having the formula:

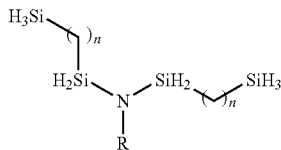

the Si—N containing precursor being (Me)N(SiH₂—CH₂—SiH₃)₂;
the Si—N containing precursor being (Et)N(SiH₂—CH₂—SiH₃)₂
the Si—N containing precursor being (nPr)N(SiH₂—CH₂—SiH₃)₂;
the Si—N containing precursor being (iPr)N(SiH₂—CH₂—SiH₃)₂;
the Si—N containing precursor being (Bu)N(SiH₂—CH₂—SiH₃)₂;
the Si—N containing precursor being (iBu)N(SiH₂—CH₂—SiH₃)₂;
the Si—N containing precursor being (tBu)N(SiH₂—CH₂—SiH₃)₂;
the Si—N containing precursor being (amyl)N(SiH₂—CH₂—SiH₃)₂;
the Si—N containing precursor being (hexyl)N(SiH₂—CH₂—SiH₃)₂;
$R^1=R$;
$R^2=R'$;
$R^3=R^4=H$;
the Si—N containing precursor having the formula:

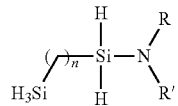

the Si—N containing precursor having the formula $H_3Si—CH_2—SiH_2—NEt_2$;
the Si—N containing precursor having the formula $H_3Si—CH_2—SiH_2—NiPr_2$;
$R^1=R$;
$R^2=R'$;
$R^3=H$;
$R^4=NRR'$;
the Si—N containing precursor having the formula:

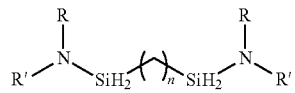

$R^1=R$;
$R^2=R'$;
$R^3=NRR'$;
$R^4=H$;
the Si—N containing precursor having the formula:

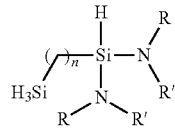

$R^1=R$;
$R^2=C(Me)=NR$;
$R^3=R^4=H$;
the Si—N containing precursor having the formula $H_3Si(CH_2)_nSiH_2N(R)C(Me)=NR$;
$R^1=R$;
$R^2=C(Me)=NR$;
$R^3=H$;
$R^4=N(R)C(Me)=NR'$;
the Si—N containing precursor having the formula: $RN=C(Me)N(R)SiH_2(CH_2)_nSiH_2N(R)C(Me)=NR$;
$R^1=SiH_2—(CH_2)_n—SiH_2—NH—SiH_2—(CH_2)_n—SiH_3$;
$R^2=R^4=R^3=H$;
the Si—N containing precursor having the formula: $H_3Si(CH_2)_nSiH_2NHSiH_2(CH_2)_nSiH_2NHSiH_2(CH_2)_nSiH_3$;
$R^1=R^2=R^3=H$;
$R^4=NH—SiH_2—(CH_2)_n—SiH_3$;
the Si—N containing precursor having the formula $H_3Si(CH_2)_nSiH_2NHSiH_2(CH_2)_nSiH_2NH_2$;
the Si-containing film forming composition comprising between approximately 95% w/w and approximately 100% w/w of the precursor;
the Si-containing film forming composition comprising between approximately 5% w/w and approximately 50% w/w of the precursor;
the Si-containing film forming composition comprising between approximately 0 ppbw and approximately 500 ppbw Al;

the Si-containing film forming composition comprising between approximately 0 ppbw and approximately 500 ppbw As;
the Si-containing film forming composition comprising between approximately 0 ppbw and approximately 500 ppbw Ba;
the Si-containing film forming composition comprising between approximately 0 ppbw and approximately 500 ppbw Be;
the Si-containing film forming composition comprising between approximately 0 ppbw and approximately 500 ppbw Bi;
the Si-containing film forming composition comprising between approximately 0 ppbw and approximately 500 ppbw Cd;
the Si-containing film forming composition comprising between approximately 0 ppbw and approximately 500 ppbw Ca;
the Si-containing film forming composition comprising between approximately 0 ppbw and approximately 500 ppbw Cr;
the Si-containing film forming composition comprising between approximately 0 ppbw and approximately 500 ppbw Co;
the Si-containing film forming composition comprising between approximately 0 ppbw and approximately 500 ppbw Cu;
the Si-containing film forming composition comprising between approximately 0 ppbw and approximately 500 ppbw Ga;
the Si-containing film forming composition comprising between approximately 0 ppbw and approximately 500 ppbw Ge;
the Si-containing film forming composition comprising between approximately 0 ppbw and approximately 500 ppbw Hf;
the Si-containing film forming composition comprising between approximately 0 ppbw and approximately 500 ppbw Zr;
the Si-containing film forming composition comprising between approximately 0 ppbw and approximately 500 ppbw In;
the Si-containing film forming composition comprising between approximately 0 ppbw and approximately 500 ppbw Fe;
the Si-containing film forming composition comprising between approximately 0 ppbw and approximately 500 ppbw Pb;
the Si-containing film forming composition comprising between approximately 0 ppbw and approximately 500 ppbw Li;
the Si-containing film forming composition comprising between approximately 0 ppbw and approximately 500 ppbw Mg;
the Si-containing film forming composition comprising between approximately 0 ppbw and approximately 500 ppbw Mn;
the Si-containing film forming composition comprising between approximately 0 ppbw and approximately 500 ppbw W;
the Si-containing film forming composition comprising between approximately 0 ppbw and approximately 500 ppbw Ni;
the Si-containing film forming composition comprising between approximately 0 ppbw and approximately 500 ppbw K;
the Si-containing film forming composition comprising between approximately 0 ppbw and approximately 500 ppbw Na;
the Si-containing film forming composition comprising between approximately 0 ppbw and approximately 500 ppbw Sr;
the Si-containing film forming composition comprising between approximately 0 ppbw and approximately 500 ppbw Th;
the Si-containing film forming composition comprising between approximately 0 ppbw and approximately 500 ppbw Sn;
the Si-containing film forming composition comprising between approximately 0 ppbw and approximately 500 ppbw Ti;
the Si-containing film forming composition comprising between approximately 0 ppbw and approximately 500 ppbw U;
the Si-containing film forming composition comprising between approximately 0 ppbw and approximately 500 ppbw V;
the Si-containing film forming composition comprising between approximately 0 ppbw and approximately 500 ppbw Zn;
the Si-containing film forming composition comprising between approximately 0 ppmw and approximately 500 ppmw Cl;
the Si-containing film forming composition comprising between approximately 0 ppmw and approximately 500 ppmw Br;
the Si-containing film forming composition comprising between approximately 0 ppmw and approximately 500 ppmw I;
the Si-containing film forming composition comprising between approximately 0.0% w/w and 0.1% w/w unreacted reactant having a Si—$(CH_2)_n$—Si backbone;
the Si-containing film forming composition comprising between approximately 0.0% w/w and 0.1% w/w disilapropane;
the Si-containing film forming composition comprising between approximately 0.0% w/w and 0.1% w/w disilabutane;
the Si-containing film forming composition comprising between approximately 0.0% w/w and 0.1% w/w $NH_3$;
the Si-containing film forming composition comprising between approximately 0.0% w/w and 0.1% w/w alkylamines;
the Si-containing film forming composition comprising between approximately 0.0% w/w and 0.1% w/w dialkylamines;
the Si-containing film forming composition comprising between approximately 0.0% w/w and 0.1% w/w alkylimines;
the Si-containing film forming composition comprising between approximately 0.0% w/w and 0.1% w/w amidines;
the Si-containing film forming composition comprising between approximately 0.0% w/w and 0.1% w/w tetrahydrofuran (THF);
the Si-containing film forming composition comprising between approximately 0.0% w/w and 0.1% w/w ether;
the Si-containing film forming composition comprising between approximately 0.0% w/w and 0.1% w/w pentane;
the Si-containing film forming composition comprising between approximately 0.0% w/w and 0.1% w/w cyclohexane;

the Si-containing film forming composition comprising between approximately 0.0% w/w and 0.1% w/w heptanes; and the Si-containing film forming composition comprising between approximately 0.0% w/w and 0.1% w/w toluene.

Also disclosed are Si-containing film forming composition delivery devices comprising a canister having an inlet conduit and an outlet conduit and containing any of the Si-containing film forming compositions disclosed above. The disclosed device may include one or more of the following aspects:

the Si-containing film forming composition having a total concentration of metal contaminants of less than 10 ppmw;

an end of the inlet conduit end located above a surface of the Si-containing film forming composition and an end of the outlet conduit located below the surface of the Si-containing film forming composition;

an end of the inlet conduit end located below a surface of the Si-containing film forming composition and an end of the outlet conduit located above the surface of the Si-containing film forming composition;

further comprising a diaphragm valve on the inlet and the outlet;

the Si-containing film forming composition being $H_3Si$—$CH_2$—$SiH_2$—NH—$SiH_2$—$CH_2$—$SiH_3$;

the Si-containing film forming composition being $N(SiH_2$—$CH_2$—$SiH_3)_3$;

the Si-containing film forming composition being $H_3Si$—$CH_2$—$CH_2$—$SiH_2$—NH—$SiH_2$—$CH_2$—$CH_2$—$SiH_3$;

the Si-containing film forming composition being $N(SiH_2$—$CH_2$—$CH_2$—$SiH_3)_3$;

the Si-containing film forming composition being $H_3Si$—$CH_2$—$SiH_2$—$NEt_2$; and the Si-containing film forming composition being $H_3Si$—$CH_2$—$SiH_2$—$NiPr_2$.

Also disclosed are methods for synthesizing any of the Si—N containing precursor disclosed above. The disclosed methods utilize a catalytic cross-dehydrogenative coupling of a compound containing Si—$(CH_2)_n$—Si backbone, wherein n is 1 or 2 (such as disilapropane or disilabutane) with $NH_3$; $RNH_2$, $R_2NH$, or amidine, wherein R may each independently be H, a $C_1$ to $C_6$ alkyl group, or a $C_3$-$C_{20}$ aryl, heterocycle or cycloalkyl group; or an amidine, in the presence of a transition metal catalyst. The disclosed methods may include one or more of the following aspects:

the Si—$(CH_2)_n$—Si backbone being a Si—$(CH_2)$—Si backbone;

the Si—$(CH_2)_n$—Si backbone being a Si—$(CH_2)_2$—Si backbone;

the Si—$(CH_2)_n$—Si backbone being disilapropane;

the Si—$(CH_2)_n$—Si backbone being a cyclic (—$SiH_2$—$CH_2$—)$_3$ compound;

the Si—$(CH_2)_n$—Si backbone being cyclo-trisilaheptane;

the Si—$(CH_2)_n$—Si backbone being N,N'-diisopropylacetimidamide;

catalytic cross-dehydrogenative coupling of the compound using $NH_3$;

catalytic cross-dehydrogenative coupling of the compound using $RNH_2$;

catalytic cross-dehydrogenative coupling of the compound using $R_2NH$;

catalytic cross-dehydrogenative coupling of the compound using amidine;

catalytic cross-dehydrogenative coupling of the compound using N,N'-diisopropylacetimidamide;

the catalyst being a metal supported on carbon;

the metal being Ru, Pd, Rh, Ir, Fe, Ni, Pt, Cr, Cu or Au;

the catalyst being selected from the group consisting of Ru on carbon, Pd(0) on MgO, supported Au nanoparticles, metal carbonyls, f-elements, and transition metal organometallic complexes;

a target reaction temperature ranging from 0 to 600° C.;

the reactor being a batch reactor in which a predetermined amount of catalyst and reactants is added prior to heating the reactor to the target temperature; and the reactor being a continuous reactor in which the reactants are fed continuously over a fixed bed of catalyst and in which the reaction products are bled continuously.

Also disclosed are methods of depositing a Si-containing layer on a substrate. Any of the Si-containing film forming compositions disclosed above is introduced into a reactor having a substrate disposed therein. At least part of the Si—N containing precursor is deposited onto the substrate to form a Si-containing layer using a vapor deposition method. The disclosed methods may have one or more of the following aspects:

the Si—N containing precursor having the formula: $R^1R^2N$—$SiHR^3$—$(CH_2)_n$—$SiH_2R^4$, wherein $R^1$, $R^2$, $R^3$ and $R^4$ may each independently be H, a $C_1$ to $C_6$ alkyl group, or a $C_3$-$C_{20}$ aryl, heterocycle or cycloalkyl group; $R^3$ and $R^4$ may each independently be H; an amino group —NRR' with R and R' each independently being H, a $C_1$ to $C_6$ alkyl group, or a $C_3$-$C_{20}$ aryl, heterocycle or cycloalkyl group; or —N(R)C(Me)=NR' group with R and R' each independently being H, a $C_1$ to $C_6$ alkyl group, or a $C_3$-$C_{20}$ aryl, heterocycle or cycloalkyl group; and n=1 or 2; provided that when n=2, $R^1$=$R^2$≠Et, $R^3$≠$NEt_2$, $R^4$≠H or $NEt_2$;

introducing into the reactor a vapor comprising a second precursor;

an element of the second precursor being selected from the group consisting of group 2, group 13, group 14, transition metal, lanthanides, and combinations thereof;

the element of the second precursor being selected from As, B, P, Si, Ge, Al, Zr, Hf, Ti, Nb, Ta, or lanthanides;

introducing a reactant into the reactor;

the reactant being selected from the group consisting of $O_2$, $O_3$, $H_2O$, $H_2O_2$, NO, $NO_2$, a carboxylic acid, an alcohol, a diol, radicals thereof, and combinations thereof;

the reactant being plasma treated oxygen;

the Si-containing layer being a silicon oxide containing layer;

the reactant being selected from the group consisting of $N_2$,$H_2$, $NH_3$, hydrazines (such as $N_2H_4$, $MeHNNH_2$, MeHNNHMe), organic amines (such as $NMeH_2$, $NEtH_2$, $NMe_2H$, $NEt_2H$, $NMe_3$, $NEt_3$, $(SiMe_3)_2NH$), pyrazoline, pyridine, radical species thereof, and mixtures thereof;

the reactant being $O_2$, $O_3$, $H_2O$, $H_2O_2$, NO, $NO_2$, $N_2O$, alcohols, diols, carboxylic acids, ketones, ethers, O atoms, O radicals, O ions, ammonia, $N_2$, N atoms, N radicals, N ions, saturated or unsaturated hydrazine, amines, diamines, ethanolamine, $H_2$, H atoms, H radicals, H ions, or combinations thereof;

forming the Si-containing film under an inert atmosphere, a H-containing atmosphere, a N-containing atmosphere, an O-containing atmosphere, or combinations thereof;

the vapor deposition method being a chemical vapor deposition process;

the vapor deposition method being an ALD process;
the vapor deposition method being a spatial ALD process;
the vapor deposition process being a flowable CVD process;
the vapor deposition process being a low pressure chemical vapor deposition (LPCVD);
the vapor deposition process being a sub-atmospheric chemical vapor deposition (SACVD);
the vapor deposition process being a plasma enhanced chemical vapor deposition (PECVD);
the vapor deposition process being a plasma enhanced atomic layer deposition (PEALD);
the vapor deposition process being a ultraviolet (UV) assisted ALD;
the vapor deposition process being a catalyzed ALD;
the vapor deposition process being a spatial isolation ALD;
the silicon-containing layer being SiC;
the silicon-containing layer being SiOC;
the silicon-containing layer being SiOCN;
the silicon-containing layer being SiCN;
thermal annealing the Si-containing layer;
thermal annealing the Si-containing layer under a reactive atmosphere;
UV curing the Si-containing layer; and
Electron beam curing the Si-containing layer.
The effect of such a post deposition treatment may be to densify or to modify the composition of the deposited film.

NOTATION AND NOMENCLATURE

Certain abbreviations, symbols, and terms are used throughout the following description and claims, and include:

As used herein, the indefinite article "a" or "an" means one or more than one.

As used herein, the terms "approximately" or "about" mean ±10% of the value stated.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1{}_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, n-propyl groups, n-butyl groups, etc. Examples of branched alkyls groups include without limitation, iso-propyl, t-butyl. Examples of cyclic alkyl groups include without limitation, cyclopropyl groups, cyclopentyl groups, cyclohexyl groups, etc.

As used herein, the term "aryl" refers to aromatic ring compounds where one hydrogen atom has been removed from the ring. As used herein, the term "heterocycle" refers to a cyclic compound that has atoms of at least two different elements as members of its ring.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, t-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); and the abbreviation "Cy" refers to a cyclic alkyl group (cyclobutyl, cyclopentyl, cyclohexyl, etc.).

As used herein, the acronym "SRO" stands for a Strontium Ruthenium Oxide film; the acronym "HCDS" stands for hexachlorodisilane; the acronym "PCDS" stands for pentachlorodisilane; the acronym "OCTS" stands for n-octyltrimethoxysilane; the acronym "TSA" stands for trisilylamine or $N(SiH_3)_3$; the acronym "DSA" stands for disilylamine or $HN(SiH_3)_2$; and the acronym "PTFE" stands for Polytetrafluoroethylene.

As used herein, the acronym "LCD-TFT" stands for liquid-crystal display-thin-film transistor; the acronym "MIM" stands for Metal-insulator-metal; the acronym "DRAM" stands for dynamic random-access memory; the acronym "FeRAM" stands for Ferroelectric random-access memory; the acronym "OLED" stands for organic light-emitting diode; the acronym "sccm" stands for standard cubic centimeter; the acronym "SSLB" stands for stainless steel lecture bottle; and the acronym "GCMS" stands for Gas Chromatography-Mass Spectrometry.

The standard abbreviations of the elements from the periodic table of elements are used herein. It should be understood that elements may be referred to by these abbreviations (e.g., Si refers to silicon, N refers to nitrogen, 0 refers to oxygen, C refers to carbon, etc.).

Please note that the films or layers deposited, such as silicon oxide, are listed throughout the specification and claims without reference to their proper stoichoimetry (i.e., $SiO_2$). The layers may include pure (Si) layers, silicide ($M_oSi_p$) layers, carbide ($Si_oC_p$) layers, nitride ($Si_kN_l$) layers, oxide ($Si_nO_m$) layers, or mixtures thereof; wherein M is an element and k, l, m, n, o, and p inclusively range from 1 to 6. For instance, cobalt silicide is $Co_kSi_l$, where k and l each range from 0.5 to 5. Similarly, any referenced layers may also include a Silicon oxide layer, $Si_nO_m$, wherein n ranges from 0.5 to 1.5 and m ranges from 1.5 to 3.5. More preferably, the silicon oxide layer is $SiO_2$ or $SiO_3$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

Any and all ranges recited herein are inclusive of their endpoints (i.e., x=1 to 4 includes x=1, x=4, and x=any number in between), irrespective of whether the term "inclusively" is used.

As used herein, the abbreviation "$N^{R,\ R'}R$"-amd" or $N^R$R"-amd when R=R' refers to the amidinate ligand [R—N—C(R")=N—R'], wherein R, R' and R" are defined alkyl groups, such as Me, Et, nPr, iPr, nBu, iBi, sBu or tBu; the abbreviation $N^{R,\ R'}$-fmd" or $N^R$-fmd when R=R' refers to the formidinate ligand [R—N—C(H)=N—R'], wherein R and R' are defined alkyl groups, such as Me, Et, nPr, iPr, nBu, iBi, sBu or tBu; the abbreviation "$N^{R,\ R'},\ N^{R",\ R'''}$-gnd" or $N^R$, $N^{R'}$-gnd when R=R' and R"=R''' refers to the guanidinate ligand [R—N—C(NR"R''')=NR'], wherein R, R', R'' and R''' are defined alkyl group such as Me, Et, nPr, iPr, nBu, iBi, sBu or tBu. Although depicted here as having a double bond between the C and N of the ligand backbone, one of ordinary skill in the art will recognize that the amidinate, formamidinate and guanidinate ligands do not contain a fixed double bond. Instead, one electron is delocalized amongst the N—C—N chain.

i) 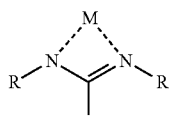

Amidinate ligand ii) 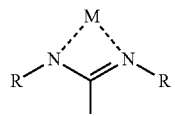

Formamidinate ligand iii) 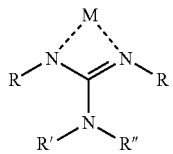

Guanidinate ligand

BRIEF DESCRIPTION OF THE DRAWINGS

For a further understanding of the nature and objects of the present invention, reference should be made to the following detailed description, taken in conjunction with the accompanying figure wherein.

DESCRIPTION OF PREFERRED EMBODIMENTS

Figure 1:
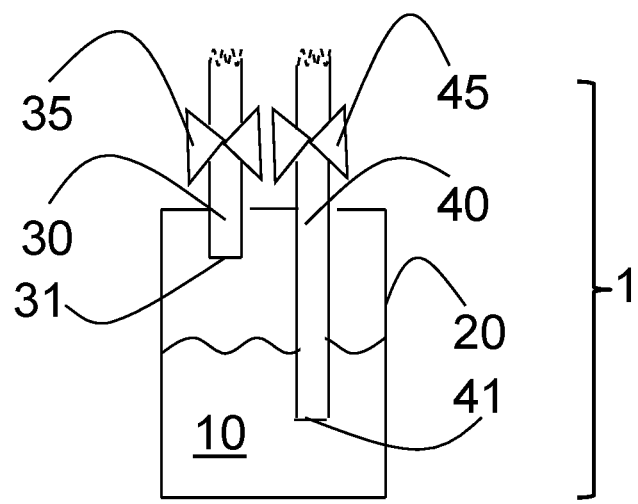
FIG. 1 is a side view of one embodiment of the Si-containing film forming composition delivery device 1.

Disclosed are Si-containing film forming compositions comprising a Si—N containing precursor having the following formula:

$$R^1R^2N—SiHR^3—(CH_2)_n—SiH_2R^4 \quad (I)$$

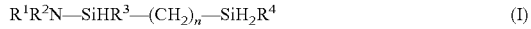

wherein n=1 or 2; $R^1$ and $R^2$ may independently be H, a $C_1$ to $C_6$ alkyl group, or a $C_3$-$C_{20}$ aryl, heterocycle or cycloalkyl group; $R^3$ and $R^4$ may independently be H; an amino group [—NRR'] with R and R' independently being H, a $C_1$ to $C_6$ alkyl group, a $C_3$-$C_{20}$ aryl, heterocycle or cycloalkyl group; or an amidinate group having the formula —N(R)C(Me)=NR' group with R and R' independently being H, a $C_1$ to $C_6$ alkyl group, or a $C_3$-$C_{20}$ aryl, heterocycle or cycloalkyl group; provided that when n=2, $R^1$=$R^2$≠Et, $R^3$≠NEt$_2$, $R^4$≠H or NEt$_2$.

The disclosed Si—N containing precursors contain one or two hydrogen atoms directly bonded to the Si atom. These Si—H bonds may help increase the volatility of the precursor, which is important for vapor deposition processes. The disclosed precursors contain no Si-halogen bonds, which is important because halogens may damage other layers in the substrate (e.g., low k layers, copper interconnect layers, etc.). Additionally, in ALD processes, the Si—H bonds of the disclosed precursors may help to provide a larger growth rate per cycle when compared to the analogous Si-halogen containing precursors because the H atoms occupy less surface area, resulting in more molecules on the substrate surface. Inclusion of the SiH bonds (i.e., hydride functionality) may produce less steric bulk, which may allow the precursors higher reactivity to the substrate. Finally, the disclosed Si-containing film forming compositions are halogen-free (i.e., <50 ppmw) and capable of forming globally planarized, thermally stable and adherent dielectric layers and other dielectric-like layers or materials on semiconductor devices, semiconductor components, electronic components and layered materials—all heretofore appreciated by conventional and/or advanced methods and processes.

The disclosed precursor may contain one, two, or three amino groups directly bonded to a Si atom. These Si—N bonds may help increase thermal stability of the precursor, which is also important for vapor deposition processes. The amino group may also help incorporate N and C atoms into the resulting film, which may make the resulting layer more resistant to any subsequent etching processes.

One of ordinary skill in the art will recognize that the volatility provided by the Si—H bonds competes directly with the thermal stability provided by the amino groups. Applicants believe that at least HN(SiH(NiPr$_2$)—CH$_2$—SiH$_3$)$_2$ and HN(SiH$_2$—CH$_2$—SiH$_2$(NiPr$_2$))$_2$ successfully balance those competing characteristics.

One of ordinary skill in the art will recognize that embodiments in which n=1 may produce precursors having higher volatility and lower melting points, being more suitable for vapor deposition. Embodiments in which n=2 may also be suitable for vapor deposition when the resulting silicon-containing film also contains carbon. Embodiments in which n=3 may also be suitable for casting deposition methods, such as spin-on or dip coating.

The $C_3$-$C_{20}$ aryl, heterocycle or cycloalkyl group may be —SiH$_2$—(CH$_2$)$_n$—SiH$_3$, SiH$_2$—(CH$_2$)$_n$—SiH$_2$—NH—SiH$_2$—(CH$_2$)$_n$—SiH$_3$, NH—SiH$_2$—(CH$_2$)$_n$—SiH$_3$, or —C(Me)=NR group, wherein R may independently be H, a $C_1$ to $C_6$ alkyl group, or a $C_3$-$C_{20}$ aryl, heterocycle or cycloalkyl group.

Alternatively, $R^1$ and $R^2$ may independently be a H; a $C_1$ to $C_6$ alkyl group; a $C_1$ to $C_6$ alkyl group; a $C_3$-$C_{20}$ aryl, heterocycle or cycloalkyl group; —SiH$_2$—(CH$_2$)$_n$—SiH$_3$; a —SiH$_2$—(CH$_2$)$_n$—SiH$_2$—NH—SiH$_2$—(CH$_2$)$_n$—SiH$_3$; a —NH—SiH$_2$—(CH$_2$)$_n$—SiH$_3$; or a —C(Me)=NR group, wherein R may independently be H, a $C_1$ to $C_6$ alkyl group, or a $C_3$-$C_{20}$ aryl, heterocycle or cycloalkyl group.

When $R^1$=SiH$_2$—(CH$_2$)$_n$—SiH$_3$ and $R^2$=$R^3$=$R^4$=H in formula (I), exemplary Si-containing film forming compositions include HN(H$_3$Si(CH$_2$)$_n$SiH$_2$)$_2$, wherein n=1 or 2, having the formula:

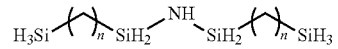

HN(SiH$_2$—CH$_2$—SiH$_3$)$_2$ is volatile and contains many Si—H bonds, making it more reactive to the substrate surface. As a result, this precursor is suitable for vapor deposition processes and, more particularly, for ALD processes. Applicants believe that this precursor may even be sufficiently reactive to attach to Si—Cl terminated or even Si terminated substrate surfaces in PEALD processes using $N_2$.

When $R^1=R^2=$—$SiH_2$—$(CH_2)_n$—$SiH_3$ and $R^3=R^4=H$ in the formula (I), exemplary Si-containing film forming compositions include $HN(H_3Si(CH_2)_nSiH_2)_2$, wherein n=1 or 2, having the formula:

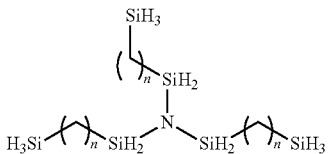

When $R^1=R$; $R^2=SiH_2$—$(CH_2)_n$—$SiH_3$; and $R^3=R^4=H$ in the formula (I), exemplary Si-containing film forming compositions include $H_3Si(CH_2)_nSiH_2NRSiH_2(CH_2)_nSiH_3$, wherein n=1 or 2R may be H, a $C_1$ to $C_6$ alkyl group, or a $C_3$-$C_{20}$ aryl, heterocycle or cycloalkyl group, having the formula:

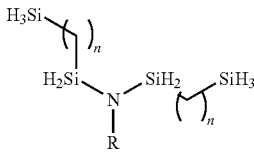

Exemplary precursors include (Me)N(SiH₂—CH₂—SiH₃)₂, (Et)N(SiH₂—CH₂—SiH₃)₂, (nPr)N(SiH₂—CH₂—SiH₃)₂, (iPr)N(SiH₂—CH₂—SiH₃)₂, (Bu)N(SiH₂—CH₂—SiH₃)₂, (iBu)N(SiH₂—CH₂—SiH₃)₂, (tBu)N(SiH₂—CH₂—SiH₃)₂, (amyl)N(SiH₂—CH₂—SiH₃)₂, and (hexyl)N(SiH₂—CH₂—SiH₃)₂. This family of compounds may be useful for deposition of films having carbon content, such as SiOC or SiNC, because the Si≥C bond (for Si—R) is not highly reactive and is likely to remain intact during the deposition process. As a result, to prevent deposition of too much C, R is preferably Me to Pr. These precursors are also easier to synthesize than the N(SiH₂—CH₂—SiH₃) analogs because the RNHR₂ reactant is a liquid for Et, Pr, Bu, Pentyl, and Hexyl.

When $R^1=R$; $R^2=R'$; $R^3=R^4=H$ in formula (I), exemplary Si-containing film forming compositions include $R^1R^2NSiH_2(CH_2)_nSiH_3$, wherein n=1 or 2, R and R' may each independently be H, a $C_1$ to $C_6$ alkyl group, or a $C_3$-$C_{20}$ aryl, heterocycle or cycloalkyl group, having the formula:

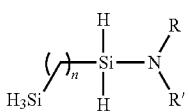

When $R^1=R$; $R^2=R'$; $R^3=H$; $R^4=NRR'$ in formula (I), exemplary Si-containing film forming compositions include $RR'NSiH_2(CH_2)_nSiH_2NRR'$, wherein n=1 or 2, R and R' may each independently be H, a $C_1$ to $C_6$ alkyl group, or a $C_3$-$C_{20}$ aryl, heterocycle or cycloalkyl group, having the formula:

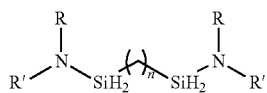

When $R^1=R$; $R^2=R'$; $R^3=NRR'$; $R^4=H$ in formula (I), exemplary Si-containing film forming compositions include $H_3Si(CH_2)_nSiH(NRR')_2$, wherein n=1 or 2, R and R' may each independently be H, a $C_1$ to $C_6$ alkyl group, or a $C_3$-$C_{20}$ aryl, heterocycle or cycloalkyl group, provided that when n=2, R and R'≠Et, having the formula:

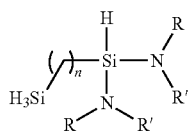

When $R^1=R$; $R^2=C(Me)=NR$; $R^3=R^4=H$ in formula (I), exemplary Si-containing film forming compositions include $H_3Si(CH_2)_nSiH_2N(R)C(Me)=NR$, wherein n=1 or 2.

When $R^1=R$; $R^2=C(Me)=NR$; $R^3=H$; $R^4=N(R)C(Me)=NR'$ in formula (I), exemplary Si-containing film forming compositions include $RN=C(Me)N(R)SiH_2(CH_2)_nSiH_2N(R)C(Me)=NR$, wherein n=1 or 2.

When $R^1=SiH_2$—$(CH_2)_n$—$SiH_2$—$NH$—$SiH_2$—$(CH_2)_n$—$SiH_3$; $R^2=R^4=R^3=H$ in formula (I), exemplary Si-containing film forming compositions include $H_3Si(CH_2)_nSiH_2NHSiH_2(CH_2)_nSiH_2NHSiH_2(CH_2)_nSiH_3$, wherein n=1 or 2, R may each independently be H, a $C_1$ to $C_6$ alkyl group, or a $C_3$-$C_{20}$ aryl, heterocycle or cycloalkyl group, provided that when n=2, R and R'≠Et.

When $R^1=R^2=R^3=H$; $R^4=NH$—$SiH_2$—$(CH_2)_n$—$SiH_3$ in formula (I), exemplary Si-containing film forming compositions include $H_3Si(CH_2)_nSiH_2NHSiH_2(CH_2)_nSiH_2NH_2$, wherein n=1 or 2, R may each independently be H, a $C_1$ to $C_6$ alkyl group, or a $C_3$-$C_{20}$ aryl, heterocycle or cycloalkyl group.

Figure 2:
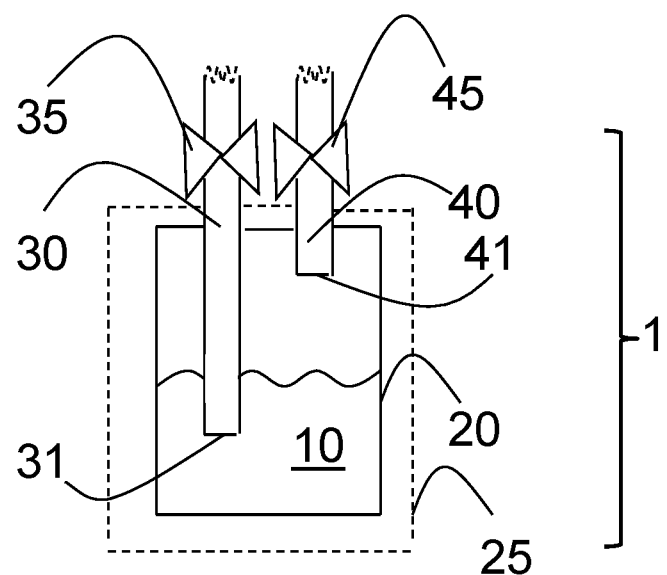
FIG. 2 is a side view of a second embodiment of the Si-containing film forming composition delivery device 1.

The disclosed Si-containing film forming compositions may be delivered to a semiconductor processing tool by the disclosed Si-containing film forming composition delivery devices. FIGS. 1 and 2 show two embodiments of the disclosed delivery devices 1.

FIG. 1 is a side view of one embodiment of the Si-containing film forming composition delivery device 1. In FIG. 1, the disclosed Si-containing film forming composition 10 are contained within a container 20 having two conduits, an inlet conduit 30 and an outlet conduit 40. One of ordinary skill in the precursor art will recognize that the container 20, inlet conduit 30, and outlet conduit 40 are manufactured to prevent the escape of the gaseous form of the Si-containing film forming composition 10, even at elevated temperature and pressure.

Suitable valves include spring-loaded or tied diaphragm valves. The valve may further comprise a restrictive flow orifice (RFO). The delivery device should be connected to a gas manifold and in an enclosure. The gas manifold should permit the safe evacuation and purging of the piping that may be exposed to air when the delivery device is replaced so that any residual amount of the pyrophoric material does not react. The enclosure should be equipped with sensors and fire control capability to control the fire in the case of a pyrophoric material release, such as $SiH_4$. The gas manifold should also be equipped with isolation valves, vacuum generators, and permit the introduction of a purge gas at a minimum.

The delivery device must be leak tight and be equipped with valves that do not permit escape of even minute amounts of the material. The delivery device fluidly connects to other components of the semiconductor processing tool, such as the gas cabinet disclosed above, via valves 35 and 45. Preferably, the delivery device 20, inlet conduit 30, valve 35, outlet conduit 40, and valve 45 are made of 316L EP or 304 stainless steel. However, one of ordinary skill in the art will recognize that other non-reactive materials may also be used in the teachings herein and that any corrosive Si-containing film forming composition 10 may require the use of more corrosion-resistant materials, such as Hastelloy or Inconel.

In FIG. 1, the end 31 of inlet conduit 30 is located above the surface of the Si-containing film forming composition 10, whereas the end 41 of the outlet conduit 40 is located below the surface of the Si-containing film forming composition 10. In this embodiment, the Si-containing film forming composition 10 is preferably in liquid form. An inert gas, including but not limited to nitrogen, argon, helium, and mixtures thereof, may be introduced into the inlet conduit 30. The inert gas pressurizes the delivery device 20 so that the liquid Si-containing film forming composition 10 is forced through the outlet conduit 40 and to components in the semiconductor processing tool (not shown). The semiconductor processing tool may include a vaporizer which transforms the liquid Si-containing film forming composition 10 into a vapor, with or without the use of a carrier gas such as helium, argon, nitrogen or mixtures thereof, in order to deliver the vapor to a chamber where a wafer to be repaired is located and treatment occurs in the vapor phase. Alternatively, the liquid Si-containing film forming composition 10 may be delivered directly to the wafer surface as a jet or aerosol.

FIG. 2 is a side view of a second embodiment of the Si-containing film forming composition delivery device 1. In FIG. 2, the end 31 of inlet conduit 30 is located below the surface of the Si-containing film forming composition 10, whereas the end 41 of the outlet conduit 40 is located above the surface of the Si-containing film forming composition 10. FIG. 2, also includes an optional heating element 25, which may increase the temperature of the Si-containing film forming composition 10. The Si-containing film forming composition 10 may be in solid or liquid form. An inert gas, including but not limited to nitrogen, argon, helium, and mixtures thereof, is introduced into the inlet conduit 30. The inert gas flows through the Si-containing film forming composition 10 and carries a mixture of the inert gas and vaporized Si-containing film forming composition 10 to the outlet conduit 40 and to the components in the semiconductor processing tool.

Both FIGS. 1 and 2 include valves 35 and 45. One of ordinary skill in the art will recognize that valves 35 and 45 may be placed in an open or closed position to allow flow through conduits 30 and 40, respectively. Either delivery device 1 in FIG. 1 or 2, or a simpler delivery device having a single conduit terminating above the surface of any solid or liquid present, may be used if the Si-containing film forming composition 10 is in vapor form or if sufficient vapor pressure is present above the solid/liquid phase. In this case, the Si-containing film forming composition 10 is delivered in vapor form through the conduit 30 or 40 simply by opening the valve 35 in FIG. 1 or 45 in FIG. 2, respectively. The delivery device 1 may be maintained at a suitable temperature to provide sufficient vapor pressure for the Si-containing film forming composition 10 to be delivered in vapor form, for example by the use of an optional heating element 25.

While FIGS. 1 and 2 disclose two embodiments of the Si-containing film forming composition delivery device 1, one of ordinary skill in the art will recognize that the inlet conduit 30 and outlet conduit 40 may both be located above or below the surface of the Si-containing film forming composition 10 without departing from the disclosure herein. Furthermore, inlet conduit 30 may be a filling port. Finally, one of ordinary skill in the art will recognize that the disclosed Si-containing film forming compositions may be delivered to semiconductor processing tools using other delivery devices, such as the ampoules disclosed in WO 2006/059187 to Jurcik et al., without departing from the teachings herein.

The disclosed Si-containing film forming compositions may have suitable properties for vapor deposition processes, such as high vapor pressure, low melting point (preferably being in liquid form at room temperature), low sublimation point, and/or high thermal stability.

The disclosed Si-containing film forming compositions may be suitable for the deposition of Si-containing films by various ALD or CVD processes and may have the following advantages:
volatile compounds;
liquid at room temperature or having a melting point lower than 50° C.;
thermally stable to enable proper distribution (gas phase or direct liquid injection) without particles generation;
suitable reactivity with the substrate to permit a wide self-limited ALD window, allowing deposition of a variety of Si -containing films.

Silicon carbo-nitride and silicon carbo-oxide containing films (referred to as SiOC and SiNC) may be deposited by CVD or ALD using the disclosed Si-containing film forming compositions and one or a combination of reactants selected from the group consisting of $N_2$, $H_2$, $NH_3$, $O_2$, $H_2O$, $H_2O_2$, $O_3$, NO, $NO_2$, $N_2O$, a carboxylic acid (such as formic acid, acetic acid, or propanoic acid), an alcohol, such as methanol, ethanol, isopropanol, a diol (such as ethylene glycol or hydrated hexafluoroacetone), hydrazines (such as $N_2H_4$, MeHNNH$_2$, MeHNNHMe), organic amines (such as NMeH$_2$, NEtH$_2$, NMe$_2$H, NEt$_2$H, NMe$_3$, NEt$_3$, (SiMe$_3$)$_2$NH), pyrazoline, pyridine, a combination thereof, the plasma product thereof, and combinations thereof.

The Si-containing film forming compositions may also be used in conjunction with another silicon source, such as a halosilane (possibly selected from SiH$_3$Cl, SiH$_2$Cl$_2$, SiHCl$_3$, SiCl$_4$, SiBr$_4$, SiI$_4$, SiHI$_3$, SiH$_2$I$_2$, SiH$_3$I, SiF$_4$), a polysilane SiH$_x$H$_{2x+2}$, or a cyclic polysilane SiH$_x$H$_{2x}$, a halo-polysilane (Si$_x$Cl$_{2x+2}$, Si$_x$H$_y$Cl$_{2x+2-y}$, such as hexachlorodisilane (HCDS), octochlorotrisilane (OCTS), pentachlorodisilane (PCDS), monochlorodisilane (MCDS), or dichlorodisilane (DCDS), a carbosilane having a Si—(CH$_2$)$_n$—Si backbone, with n=1 or 2, or combinations thereof.

Also, disclosed are methods for synthesizing the disclosed Si-containing film forming compositions. The disclosed synthesis methods may be based on a catalytic cross-dehydrogenative coupling of a Si—CH$_2$—Si backbone or a Si—CH$_2$—CH$_2$—Si backbone with NH$_3$, RNH$_2$ (where R may each independently be H, a $C_1$ to $C_6$ alkyl group or a $C_3$-$C_{20}$ aryl, heterocycle or cycloalkyl group), or an amidine. Herein, catalytic dehydrogenative coupling between carbosilanes and ammonia, amines or amidines may present an attractive synthetic approach to this family of silylamines.

Herein examples of the carbosilanes may be disilapropane, disilabutane, or a cyclic (—SiH$_2$—CH$_2$—)$_n$ compound, with n being 2-6, such as cyclo-trisilahexane (with n=3).

The disclosed synthesis methods synthesize the disclosed Si-containing film forming compositions without the formation of halogen salt byproducts. All of the Si-containing film forming compositions produced by the methods of synthesis described and claimed herein are "halogen free" as that term is defined herein. This approach is based on the catalytic dehydrocoupling of hydrogen to form gas and a nitrogen-silicon bond. The process is catalyzed by transition metal catalysts. Catalysts may be heterogeneous or homogeneous. The reaction is exothermic. The reaction may be carried out in a solvent or without a solvent. The reaction may be carried out in a batch or continuous flow reactor. When a batch reactor is used, the reactor may be attached to a condenser connected to a cryotrap. In this assembly, the formed hydrogen may be vented as the reaction takes place. The pressure may be controlled by a back pressure regulator attached between the condenser and the cryotrap. The cryotrap may be connected to a vent line allowing sending hydrogen out of the system during and/or after the reaction. The Dip-tube with filter permits easy removal of the product from the vessel.

The disclosed synthesis methods include the following steps:

a) contacting a reactant having a Si—(CH$_2$)$_n$—Si backbone containing reactant, wherein n is 1 or 2 (e.g., disilapropane or disilabutane) with NH$_3$, an amidine, RNH$_2$, or R$_2$NH, wherein each R is independently H, a C1-C6 alkyl, or C3-C20 aryl, heterocycle, or cycloalkyl group, in the presence of a transition metal catalyst forming a reaction mixture;

b) optionally adding a solvent to the reaction mixture;

c) maintaining the reaction mixture at a temperature between about 0° C. to about 250° C.;

d) allowing the reaction to proceed to form R$^1$R$^2$N—SiHR$^3$—(CH$_2$)$_n$—SiH$_2$R$^4$, wherein n=1 or 2; R$^1$ and R$^2$ may independently be H, a C$_1$ to C$_6$ alkyl group, or a C$_3$-C$_{20}$ aryl, heterocycle or cycloalkyl group; R$^3$ and R$^4$ may independently be H; an amino group [—NRR'] with R and R' independently being H, a C$_1$ to C$_6$ alkyl group, a C$_3$-C$_{20}$ aryl, heterocycle or cycloalkyl group; or a —N(R)C(Me)=NR' group with R and R' independently being H, a C$_1$ to C$_6$ alkyl group, or a C$_3$-C$_{20}$ aryl, heterocycle or cycloalkyl group; provided that when n=2, R$^1$=R$^2$≠Et, R$^3$≠NEt$_2$, R$^4$≠H or NEt$_2$; and e) separating the R$^1$R$^2$N—SiHR$^3$—(CH$_2$)$_n$—SiH$_2$R$^4$ product from the reaction mixture;

wherein the reaction mixture temperature may vary during the synthesis and is maintained such that the temperature of the reaction mixture is not allowed to drop below about 0° C. and not exceed about 250° C.

The reactor may be a vessel for batch synthesis or a flow through vessel to facilitate a continuous synthesis. The term "reaction mixture" refers to the combination of reactants, catalyst, products, and optionally solvent wherein a reaction takes place to form the product. A Parr autoclave equipped with a mechanical stirred is a suitable reaction vessel.

The term "maintaining . . . at a temperature" as used herein means heating or cooling as required to produce a temperature within the specified minimum and maximum temperature. The order of addition of N-containing reactant and silane to the reaction vessel may be either amine first or silane first. When the starting materials are halogen free, the products will be halogen and aminohalogen free.

Heterogeneous catalysts suitable in the present invention include transition metal catalysts and rare earth elements. Catalysts are selected from the group consisting of: Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg, Yb and U. Preferred catalysts are selected from the group consisting of Ru, Pd, Rh, Ir, Fe, Ni, Pt, Cr, Cu and Au. More preferred catalysts are selected from the group consisting of Rh, Pd, Ru and Pt. A most preferred catalyst is Ru and Ru on carbon. An additional preferred catalyst is Pd on MgO.

Catalysts of the present invention are preferably affixed to a support. The support is a solid with a high surface area. Typical support materials include but are not limited to: alumina, MgO, zeolites, carbon, Monolith cordierite, diatomaceous earth, silica gel, silica/alumina, ZrO and TiO$_2$. Preferred supports are carbon, alumina, silica and MgO. A more preferred support is carbon. Supports have a BET surface area ranging between about 1 m$^2$/g to about 3,000 m$^2$/g. A preferred range is about 100 m$^2$/g to about 2,000 m$^2$/g. Metal loading of the catalyst ranges between about 0.01 weight percent to about 50 weight percent. A preferred range is about 0.5 weight percent to about 20 weight percent. A more preferred range is about 0.5 weight percent to about 10 weight percent. Catalysts may be activated by a number of known methods. Heating the catalyst under vacuum is a preferred method. The catalyst may be activated before addition to the reaction vessel or in the reaction vessel prior adding the reactants.

The catalyst may contain a promoter. Promoters are substances which themselves are not catalysts, but when mixed in small quantities with the active catalysts increase their efficiency (activity and/or selectivity). Promoters are usually metals such as Mn, Ce, Mo, Li, Re, Ga, Cu, Ru, Pd, Rh, Ir, Fe, Ni, Pt, Cr, Cu and Au and/or their oxides. They may be added separately to the reactor vessel or they may be part of the catalysts themselves. For example, Ru/Mn/C (ruthenium on carbon promoted by manganese) or Pt/CeO2/Ir/SiO2 (Platinum on silica promoted by ceria and iridium). Some promoters may act as catalyst by themselves but their use in combination with the main catalyst may improve the main catalyst's activity. A catalyst may act as a promoter for other catalysts. In this context, the catalyst may be called a bimetallic (or polymetallic) catalyst. For example, Ru/Rh/C may be called either ruthenium and rhodium on carbon bimetallic catalyst or ruthenium on carbon promoted by rhodium. An active catalyst is a material that acts as a catalyst in a specific chemical reaction.

Catalysts may require activation which is typically carried out under vacuum or under an inert gas or reducing gas such as hydrogen. or helium and at elevated temperatures. Typically catalysts are activated at about 125° C. and at about −14 psig which is about 1 Torr. Dynamic vacuum as used herein describes a vacuum of about 1 Torr. Activation conditions will vary somewhat by the catalyst selected. Conditions for activating the various catalysts are known in the art. Activated catalysts may be stored for future use.

Exemplary catalysts may include but are not limited heterogeneous catalysts, such as Ru(0) on carbon (commercially available from Johnson Mathis), Pd(0) on MgO (see, e.g., Ringleb et al., Applied Catalysis A; General 474 (2014) 186-193), supported Au nanoparticles (see, e.g., Lin et al. Molecules, 2013, 18, pp. 12609-12620), or organo-f-element catalysts (i.e., lanthanide and actinide catalysts, such as (Me$_5$Cp)$_2$ThMe$_2$ adsorbed on dehydroxylated alumina). Alternatively homogeneous catalysts such as an acid or base in the same medium as the reactants (e.g., gas or liquid phase), metal carbonyl catalysts, or transition metal organometallic complexes may be used.

When solvents are used in the present invention, solvents that are non-reactive with the reactants are selected. Solvents are anhydrous and do not deactivate (poison) the catalyst. A non-limiting list of such solvents include: alkanes such as $C_5$ to $C_{20}$ linear, branched or cyclic alkanes and mixtures thereof; alkenes such as 1-octadecene, cyclooctadiene and cyclohexene; chloroalkanes such as methylene chloride and ethylene chloride; arenes such as toluene, xylene, mesitylene and naftalene and heterocycles such as quinoline and pyridine and mixtures thereof. A preferred solvent is n-octadecane. Preferably, the solvent should be selected such that its boiling point differs from the boiling point of the product compound by about 10° C.

Inert gas used in the present invention is not reactive under the reaction conditions. A non-limiting list of inert gases includes: helium, argon and nitrogen. A preferred gas is helium.

The disclosed synthesis methods allow access to Si—N containing compounds possessing the following structural motif, Si—C—Si—N and Si—C—C—Si—N. In particular, compounds $N(SiH_2CH_2SiH_3)_3$, $NH(SiH_2CH_2SiH_3)_2$ or $RN(SiH_2CH_2SiH_3)_2$ (wherein R may be H, a $C_1$ to $C_6$ alkyl group or a $C_3$-$C_{20}$ aryl, heterocycle or cycloalkyl group) may be synthesized with a halogen free process and the only by-product is hydrogen gas.

The disclosed synthesis methods include the following steps:

Charging a catalyst into a pressurized reactor equipped with a magnetic stirrer and a pressure gauge. The pressurized reactor may be a stainless steel ampoule or other pressurized reactors. The catalyst may be any transition metal catalyst selected from Ru, Pd, Rh, Ir, Fe, Ni, Pt, Cr, Cu and Au supported on carbon, Pd(0) on MgO, supported Au nanoparticles, homogeneous catalysts, metal carbonyl catalysts, organo-f-element catalysts, transition metal organometallic complexes, or the like.

One of ordinary skill in the art will recognize that the catalyst may need drying, depending on the catalyst, which may take place in the reactor under vacuum at a temperature ranging from 80-150° C. The drying temperature may also range from 0-200° C. depending on properties of the catalyst. One of the ordinary skill in the art will recognize that the drying pressure and temperature may be optimized through mere experimentation to achieve the desired result. One of ordinary skill in the art will further recognize that the catalyst may be dried immediately before synthesis or several days before synthesis so long as the catalyst is maintained under dry conditions.

In one alternative, a solvent may be introduced into the pressurized reactor. When solvents are used herein, solvents that are non-reactive with the reactants are selected. The solvents are anhydrous. A non-limiting list of such solvents include: alkanes such as n-octadecane, hexane and decalin; alkenes such as 1-octadecene, cyclooctadiene and cyclohexene; chloroalkanes such as methylene chloride and ethylene chloride; arenes such as toluene, xylene, mesitylene and naftalene and heterocycles such as quinoline and pyridine. The solvents are non-hygroscopic.

Introducing the Si—$(CH_2)_n$—Si backbone containing and N-containing reactants into the pressurized reactor under inert atmosphere (such as $N_2$, Ar or He). The Si—$(CH_2)_n$—Si backbone containing reactant contains a $H_3Si$—$(CH_2)_n$—$SiH_3$ backbone, wherein n is 1 or 2, such as, disilapropane or disilabutane. The N-containing reactant may be $NH_3$, RNH, wherein each R independently be H, a $C_1$ to $C_6$ alkyl group, or a $C_3$-$C_{20}$ aryl, heterocycle or cycloalkyl group, or an amine.

Heating gradually the pressurized reactor to a predetermined temperature and simultaneously monitoring a pressure increase inside the pressurized reactor on the pressure gauge. The predetermined temperature may range from 0 to 600° C., preferably from 0 to 400° C., more preferably from 0 to 200° C., more preferably from 0 to 150° C. Since the production of the Si—N containing precursor is volatile, the pressure inside the pressurized reactor will increase, which is monitored by the pressure gauge.

Maintaining the pressurized reactor at the predetermined temperature and stirring the contents for a predetermined time period. The predetermined time may range from several hours to tens of hours, such as from 4 to 20 hours. One of ordinary skill in the art will recognize that the predetermined temperature and time may be optimized through mere experimentation to achieve the desired precursors.

Cooling the pressurized reactor to room temperature (approximately 23° C.). A pressure increase may be observed after cooling the reactor to room temperatures.

Cryotrapping volatile reaction products and releasing noncondensable reaction products in the pressurized reactor. The term cryotrapping means condensing a gaseous material in a cryotrap. After cryotrapping the products, the pressure inside the pressurized reactor may decrease. By this way, the volatile product will be condensed under the temperature below room temperature and the product that does not condense will be separated from the condensed product and released.

Collecting condensed volatile product of the Si—N containing compound formed in the pressurized reactor. Herein the condensed product is the Si—N containing compound and the released product is $H_2$. One of ordinary skill in the art will recognize that the disclosed methods may include equipping a thermocouple, pressure transducer and 3 metering valves with the pressurized reactor besides equipping the mechanical stirrer and pressure gauge.

It is known ("Disilanylamines. Compounds comprising the structural unit silicon-silicon-nitrogen, as single-source precursors for plasma-enhanced chemical vapor deposition (PE-CVD) of silicon nitride" Schuh, H.; Schlosser, T.; Bissinger, P.; Schmidbaur, H. *Zeitschrift fuer Anorganische and Allgemeine Chemie* 1993, 619(8), 1347-1352) Si—N containing compounds, such as silylamines, may be synthesized by using traditional approaches of reacting an amine with a chlorosilane, however, a significant amount of ammonium chloride would be produced as a by-product which would compromise the efficiency of the process in terms of the extra processing required in work-up and purification. In addition, using (chlorosilyl)methylsilane as a synthetic precursor in contrast with disilapropane or disilabutane may incur much cost because of toxicity of chlorosilanes and may result in chlorine residue in the protect which may be detrimental to the film.

The advantages of the disclosed synthesis methods are as follows.

Halogen free process;
Starting materials are readily available;
Hydrogen gas is the only by-product;
One step-one pot reactions;
Highly efficient catalytic system since the catalyst may be recycled for subsequent batches;
The process may be solventless;
The waste generation is minimal and environmentally benign.

All of the above are the advantageous from the standpoint of developing a scalable industrial process.

To ensure process reliability, the disclosed Si-containing film forming composition may be purified by continuous or fractional batch distillation prior to use to a purity ranging from approximately 95% w/w to approximately 100% w/w, preferably ranging from approximately 98% w/w to approximately 100% w/w. One of ordinary skill in the art will recognize that the purity may be determined by H NMR or gas or liquid chromatography with mass spectrometry. The disclosed Si-containing film forming composition may contain any of the following impurities: unreacted Si—$(CH_2)_n$—Si backbone such as disilapropane or disilabutane; $NH_3$; alkylamines; dialkylamines; alkylimines; amidines; tetrahydrofuran (THF); ether; pentane; cyclohexane; heptanes; or toluene. Preferably, the total quantity of these impurities is below 0.1% w/w. The purified composition may be produced by recrystallisation, sublimation, distillation, and/or passing the gas or liquid through a suitable adsorbent, such as a 4A molecular sieve.

The concentration of each solvent (such as THF, ether, pentane, cyclohexane, heptanes, and/or toluene), in the purified Si-containing film forming composition may range from approximately 0% w/w to approximately 5% w/w, preferably from approximately 0% w/w to approximately 0.1% w/w. Solvents may be used in the composition's synthesis, but are not mandatory. Separation of the solvents from the composition may be difficult if both have similar boiling points. Cooling the mixture may produce a solid precursor in liquid solvent, which may be separated by filtration. Vacuum distillation may also be used, provided the precursor composition is not heated above approximately its decomposition point.

The disclosed Si-containing film forming composition contains less than 5% v/v, preferably less than 1% v/v, more preferably less than 0.1% v/v, and even more preferably less than 0.01% v/v of any of its analogs or other reaction products. The high purity composition may provide better process repeatability. The high purity composition may be produced by distillation of the Si-containing film forming composition.

Purification of the disclosed Si-containing film forming compositions may also produce concentrations of trace metals and metalloids ranging from approximately 0 ppbw to approximately 500 ppbw, and more preferably from approximately 0 ppbw to approximately 100 ppbw. These metal or metalloid impurities include, but are not limited to, Aluminum(Al), Arsenic(As), Barium(Ba), Beryllium(Be), Bismuth(Bi), Cadmium(Cd), Calcium(Ca), Chromium(Cr), Cobalt(Co), Copper(Cu), Gallium(Ga), Germanium(Ge), Hafnium(Hf), Zirconium(Zr), Indium(In), Iron(Fe), Lead (Pb), Lithium(Li), Magnesium(Mg), Manganese(Mn), Tungsten(W), Nickel(Ni), Potassium(K), Sodium(Na), Strontium(Sr), Thorium(Th), Tin(Sn), Titanium(Ti), Uranium(U), Vanadium(V) and Zinc(Zn). The concentration of X (where X=Cl, Br, I) in the purified Si-containing film forming composition may range between approximately 0 ppmw and approximately 100 ppmw and more preferably between approximately 0 ppmw to approximately 10 ppmw.

Alternatively, the disclosed Si-containing film forming compositions may comprise between approximately 5% w/w to approximately 50% w/w of one compound with the balance of the composition comprising a second compound, particularly when the mixture provides improved process parameters or isolation of the target compound is too difficult or expensive. For example, the disclosed Si-containing film forming compositions may be 40/60% w/w of $N(SiH_2CH_2SiH_3)_3$ and $NH(SiH_2CH_2SiH_3)_2$ or $H_3Si(CH_2)_nSiH_2NHSiH_2(CH_2)_nSiH_2NH_2$ and $H_3Si(CH_2)_nSiH_2NHSiH_2(CH_2)_nSiH_3$. The mixture may produce a stable, liquid composition suitable for vapor deposition.

Also disclosed are methods of using the disclosed Si—N containing precursors for vapor deposition methods. The disclosed methods provide for the use of the Si—N containing precursors for deposition of silicon-containing films, preferably silicon nitride (SiN) films and silicon-oxide (SiO) films. The disclosed methods may be useful in the manufacture of semiconductor, photovoltaic, LCD-TFT, flat panel type devices, refractory materials, or aeronautics.

The disclosed methods for forming a silicon-containing layer on a substrate include: placing a substrate in a reactor, delivering into the reactor a vapor including the disclosed Si—N containing precursor, and contacting the vapor with the substrate (and typically directing the vapor to the substrate) to form a silicon-containing film on the surface of the substrate.

The disclosed Si—N containing precursors may be used to deposit silicon-containing films using any deposition methods known to those of skill in the art. Examples of suitable deposition methods include chemical vapor deposition (CVD) or atomic layer deposition (ALD). Exemplary CVD methods include thermal CVD, pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, plasma enhanced CVD (PECVD) including but not limited to flowable PECVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

The disclosed Si-containing film forming composition may consist of only the Si—N containing precursor. Alternatively, the Si-containing film forming composition may further comprise a solvent, such as toluene, ethyl benzene, xylene, mesitylene, decane, dodecane, octane, hexane, pentane, tertiary amines, acetone, tetrahydrofuran, ethanol, ethylmethylketone, 1,4-dioxane, or others. The disclosed precursors may be present in varying concentrations in the solvent. For example, the resulting concentration may range from approximately 0.05M to approximately 2M.

The Si-containing film forming composition is delivered into a reactor in vapor form by conventional means, such as tubing and/or flow meters. The composition in vapor form may be produced by vaporizing the composition through a conventional vaporization step such as direct vaporization, distillation, by bubbling, or by using a sublimator such as the one disclosed in PCT Publication WO2009/087609 to Xu et al. The composition may be fed in liquid state to a vaporizer where it is vaporized before it is introduced into the reactor. Alternatively, the composition may be vaporized by passing a carrier gas into a container containing the composition or by bubbling of the carrier gas into the composition. The carrier gas may include, but is not limited to, Ar, He, or $N_2$, and mixtures thereof. Bubbling with a carrier gas may also remove any dissolved oxygen present in the composition. The carrier gas and composition are then introduced into the reactor as a vapor.

If necessary, the container may be heated to a temperature that permits the composition to be in liquid phase and to have a sufficient vapor pressure. The container may be maintained at temperatures in the range of, for example, 0 to 150° C. Those skilled in the art recognize that the temperature of the container may be adjusted in a known manner to control the amount of composition vaporized.

The vapor of the Si-containing film forming composition is generated and then introduced into a reaction chamber containing a substrate. The temperature and the pressure in the reaction chamber and the temperature of the substrate are held at conditions suitable for vapor deposition of at least part of the Si—N containing precursor onto the substrate. In other words, after introduction of the vaporized composition into the reaction chamber, conditions within the reaction chamber are adjusted such that at least part of the vaporized precursor is deposited onto the substrate to form the Si-containing layer. One of ordinary skill in the art will recognize that "at least part of the vaporized compound is deposited" means that some or all of the compounds react with or adheres to the substrate. Herein, a reactant may also be used to help in formation of the Si-containing layer.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from about 20° C. to about 600° C. One of ordinary skill in the art will recognize that the temperature may be optimized through experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 20° C. to approximately 600° C. When a plasma deposition process is utilized, the deposition temperature may range from approximately 20° C. to approximately 550° C. Alternatively, when a thermal process is performed, the deposition temperature may range from approximately 300° C. to approximately 600° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 150° C. to 600° C. Preferably, the temperature of the substrate remains less than or equal to 500° C.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, or combinations thereof. Additionally, the wafers may include copper layers or noble metal layers (e.g. platinum, palladium, rhodium, or gold). The layers may include oxides which are used as dielectric materials in MIM, DRAM, or FeRam technologies (e.g., $ZrO_2$ based materials, $HfO_2$ based materials, $TiO_2$ based materials, rare earth oxide based materials, ternary oxide based materials such as strontium ruthenium oxide (SRO), etc.) or from nitride-based films (e.g., TaN) that are used as an oxygen barrier between copper and the low-k layer. The wafers may include barrier layers, such as manganese, manganese oxide, etc. Plastic layers, such as poly(3,4-ethylenedioxythiophene)poly(styrenesulfonate) (PEDOT:PSS) may also be used. The layers may be planar or patterned. For example, the layer may be a patterned photoresist film made of hydrogenated carbon, for example $CH_x$, wherein x is greater than zero. The disclosed processes may deposit the silicon-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from copper, silicon oxide, photoresist, hydrogenated carbon, TiN, SRO, Ru, and Si type substrates, such as polysilicon or crystalline silicon substrates. For example, a silicon nitride film may be deposited onto a Si layer. In subsequent processing, alternating silicon oxide and silicon nitride layers may be deposited on the silicon nitride layer forming a stack of multiple $SiO_2$/SiN layers used in 3D NAND gates. Furthermore, the substrate may be coated with patterned or unpatterned organic or inorganic films.

In addition to the disclosed Si-containing film forming composition, a reactant may also be introduced into the reactor. The reactant may be an oxidizing agent, such as one of $O_2$, $O_3$, $H_2O$, $H_2O_2$; oxygen containing radicals, such as O. or OH., NO, $NO_2$; carboxylic acids such as formic acid, acetic acid, propionic acid, radical species of NO, $NO_2$, alcohols, diols or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as O. or OH., and mixtures thereof. Preferably, when an ALD process is performed, the reactant is plasma treated oxygen, ozone, or combinations thereof. When an oxidizing agent is used, the resulting silicon containing film will also contain oxygen.

Alternatively, the reactant may be a nitrogen containing species, such as one of $N_2$, $NH_3$, hydrazines (for example, $N_2H_4$, $MeHNNH_2$, MeHNNHMe), organic amines (for example, $N(CH_3)H_2$, $N(C_2H_5)H_2$, $N(CH_3)_2H$, $N(C_2H_5)_2H$, $N(_CH_3)_3$, $N(C_2H_5)_3$, $(SiMe_3)_2NH$), pyrazoline, pyridine, radicals thereof, or mixtures thereof. When an N-containing source agent is used, the resulting silicon containing film will also contain nitrogen.

When a reducing agent is used, such as $H_2$, H radicals, or other H-containing gases and precursors such as metal and metalloid hydrides, the resulting silicon containing film may be SiC.

The reactant may be treated by plasma, in order to decompose the reactant into its radical form. $N_2$ may also be utilized as a reducing agent when treated with plasma. For instance, the plasma may be generated with a power ranging from about 50 W to about 500 W, preferably from about 100 W to about 200 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The disclosed Si-containing film forming compositions may also be used with a halosilane or polyhalodisilane, such as hexachlorodisilane, pentachlorodisilane, or tetrachlorodisilane, and one or more reactants to form SiC, SiCN, or SiCOH films. PCT Publication Number WO2011/123792, the entire contents of which are incorporated herein in its entirety, discloses forming a SiN layer from the combination of an aminosilane precursor and a chlorosilane precursor. The disclosed Si-containing film forming compositions may be used in place of the aminosilane precursor.

The Si-containing film forming compositions and one or more reactants may be introduced into the reaction chamber simultaneously (e.g., CVD), sequentially (e.g., ALD), or in other combinations. For example, the Si—N containing precursor may be introduced in one pulse and two additional metal sources may be introduced together in a separate pulse (e.g., modified ALD). Alternatively, the reaction chamber may already contain the reactant prior to introduction of the Si—N containing precursor. The reactant may be passed through a plasma system localized or remotely from the reaction chamber, and decomposed to radicals. Alternatively, the Si—N containing precursor may be introduced to the reaction chamber continuously while other metal sources are introduced by pulse (e.g., pulsed-CVD). In each example, a pulse may be followed by a purge or evacuation step to remove excess amounts of the component introduced. In each example, the pulse may last for a time period ranging from about 0.01 s to about 10 s, alternatively from about 0.3 s to about 3 s, alternatively from about 0.5 s to about 2 s. In another alternative, the Si—N containing precursor and one or more reactants may be simultaneously sprayed from a shower head under which a susceptor holding several wafers is spun (e.g., spatial ALD).

In one non-limiting exemplary ALD type process, the vapor phase of a Si-containing film forming composition is introduced into the reaction chamber, where it is contacted with a suitable substrate. Excess composition may then be removed from the reaction chamber by purging and/or evacuating the reaction chamber. An oxygen source is introduced into the reaction chamber where it reacts with the chemi- or physi-sorbed Si—N containing precursor in a self-limiting manner. Any excess oxygen source is removed from the reaction chamber by purging and/or evacuating the reaction chamber. If the desired film is a silicon oxycarbide film, this two-step process may provide the desired film thickness or may be repeated until a film having the necessary thickness has been obtained.

In another alternative, dense SiCN films may be deposited using an ALD method with hexachlorodisilane (HCDS) or pentachlorodisilane (PCDS), the disclosed Si-containing film forming composition, and an ammonia reactant. The reaction chamber may be controlled at 5 Torr, 550° C., with a 55 sccm continuous flow of Ar. An approximately 10 second long pulse of the Si-containing film forming composition at a flow rate of approximately 1 sccm is introduced into the reaction chamber. The Si-containing film forming composition is purged from the reaction chamber with an approximately 55 sccm flow of Ar for approximately 30 seconds. An approximately 10 second pulse of HCDS at a flow rate of approximately 1 sccm is introduced into the reaction chamber. The HCDS is purged from the reaction chamber with an approximately 55 sccm flow of Ar for approximately 30 seconds. An approximately 10 second long pulse of $NH_3$ at a flow rate of approximately 50 sccm is introduced into the reaction chamber. The $NH_3$ is purged from the reaction chamber with an approximately 55 sccm flow of Ar for approximately 10 seconds. These 6 steps are repeated until the deposited layer achieves a suitable thickness. One of ordinary skill in the art will recognize that the introductory pulses may be simultaneous when using a spatial ALD device. As described in PCT Pub No WO2011/123792, the order of the introduction of the precursors may be varied and the deposition may be performed with or without the $NH_3$ reactant in order to tune the amounts of carbon and nitrogen in the SiCN film.

In yet another alternative, a silicon-containing film may be deposited by the flowable PECVD method disclosed in U.S. Patent Application Publication No. 2014/0051264 using the disclosed compounds and a radical nitrogen- or oxygen-containing reactant. The radical nitrogen- or oxygen-containing reactant, such as $NH_3$ or $H_2O$ respectively, is generated in a remote plasma system. The radical reactant and the vapor phase of the disclosed Si-containing film forming compositions are introduced into the reaction chamber where they react and deposit the initially flowable film on the substrate. Applicants believe that the nitrogen atoms of the $(RN-SiHR-(CR)_n-SiH_2R)$ ligand and amino groups in the disclosed compounds help to further improve the flowability of the deposited film, resulting in films having less voids. Applicants believe that the films deposited using the disclosed Si-containing film forming compositions in a flowable CVD process with $NH_3$ plasma will produce a SiCN film having desired etching selectivity with respect to silicon oxide films due to the precursor's Si—C—Si backbone providing a film having sufficient C content.

In yet another embodiment, the flowable film can be deposited solely by condensation (Thermal flowable CVD, or T-FCVD) by holding the wafer to a temperature lower than the dew point of the precursor at the partial pressure of the precursor in the chamber. For such applications, having a low vapor pressure precursor (typically <50 torr at room temperature, and even preferably <10 torr at room temperature) is beneficial to facilitate the precursor condensation without chilling the wafer to very low temperature. The substituted or unsubstituted $N(SiHR-CH_2-SiH_2R)_3$ and $RN(SiHR-CH_2-SiH_2R)_2$ family of molecules have a suitable range of volatility. The cross linking of such films can then be achieved in-situ or ex-situ by one or several of various means, including but not limited to exposure of the deposited film to a reactive gas, to plasma, to photons, to an electron beam, to a neutral particle beam, or to a catalyst. The catalyst may be pre-deposited, co-deposited or post-deposited, and may be activated by means such as heating or photon exposure. Chemically speaking, such cross-linking can be achieved by a variety of chemical reactions ranging from but not restricted to Si—H/N—H $H_2$ elimination, hydrosilylation, silazane formation by condensation of amine groups, siloxane formation by condensation of silanol groups, ring opening polymerisation, and/or dehydrogenative coupling.

The silicon-containing films resulting from the processes discussed above may include $SiO_2$, SiN, SiC, SiON, SiOC, SiNC, SiONC, SiBCN, SiCN, SiMCO, wherein M is Hf, Zr, Ti, Nb, V, Ta, Al, or Ge, in which each of SiC, SiOC, SiOCN and SiCN contains 1-15% H. One of ordinary skill in the art will recognize that by judicial selection of the appropriate Si-containing film forming composition and reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 600° C. for less than 3600 seconds under a reactive H-containing atmosphere. The resulting film may be densified. Alternatively, the substrate may be removed from the reaction chamber, with the annealing/flash annealing process being performed in a separate apparatus. Any of the above post-treatment methods, but especially thermal annealing, has been found effective to reduce nitrogen content, improve the film wet etch rate and densify the film.

EXAMPLES

The following non-limiting examples are provided to further illustrate embodiments of the invention. However, the examples are not intended to be all inclusive and are not intended to limit the scope of the inventions described herein.

Example 1

Syntheses of starting materials 1,2-disilapropane (DSP) and 1,3-disilabutane (DSB)

Lithium aluminium hydride LiAlH$_4$ (LAH) was placed into a 4 L vessel equipped with a mechanical stirrer under inert atmosphere. The vessel was cooled to −78° C., and then 1 L of cold (ca. −30° C.) diglyme (H$_3$COC$_2$H$_4$OC$_2$H$_4$OCH$_3$) for DSP or di-nbutyl ether (H$_9$C$_4$OC$_4$H$_9$) for DSB was slowly added to the vessel. The mixture in the vessel was allowed to warm to −10° C. while stirring. 1,2-bis(trichlorosilyl)methane SiCl$_3$CH$_2$SiCl$_3$ or 1,2-bis(trichlorosilyl)ethane SiCl$_3$CH$_2$CH$_2$SiCl$_3$ was added dropwise to the warmed mixture, while preventing the reaction mixture from getting warmer than 20° C. After the addition, the mixture was warmed to 25° C. and stirred for 2 hours. The volatile DSP or DSB was condensed into a trap (−78° C.) at 30° C. DSP was isolated in 82% yield, 96% purity shown by Gas Chromatography (GC). DSB was isolated as color less liquid. Yield 65%, 98.8% purity shown by GC.

Example 2

Syntheses of NH(SiH$_2$CH$_2$SiH$_3$)$_2$, N(SiH$_2$CH$_2$SiH$_3$)$_3$ and H$_3$Si(CH$_2$)SiH$_2$NHSiH$_2$(CH$_2$)SiH$_2$NHSiH$_2$(CH$_2$)SiH$_3$ The syntheses of bis((silylmethyl)silyl)amine [NH(SiH$_2$CH$_2$SiH$_3$)$_2$], tris((silylmethyl)silyl)amine [N(SiH$_2$CH$_2$SiH$_3$)$_3$] are catalyzed by Ru(0) on carbon and performed in a pressurized reactor through a reaction between disilapropane and ammonia.

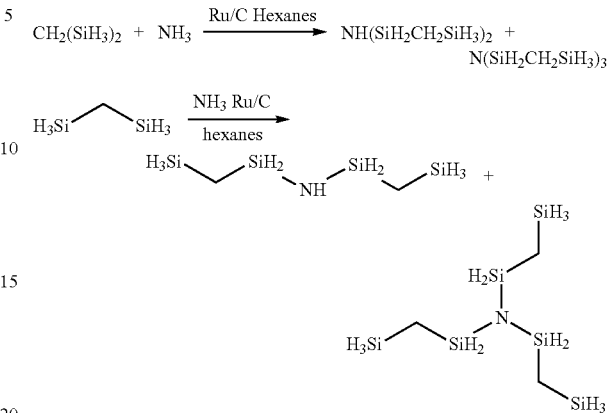

A 0.3 L autoclave equipped with a mechanical stirrer, thermocouple, pressure gauge, pressure transducer and 3 metering valves was placed in a glove box. 1 g (0.5 mmol of Ru) of 5% weight Ru on carbon catalyst was introduced into the autoclave. The autoclave was subsequently heated steadily under dynamic vacuum to 140° C. and held at this temperature for 3 hr. After cooling down to room temperature, the autoclave was pressurized with helium (800 torr) and hexanes (20 mL) was introduced. The autoclave was then cooled in a liquid nitrogen bath. Atmospheric nitrogen was removed under vacuum and then ammonia (0.247 g, 0.015 mol) and disilapropane (10 g, 0.131 mol) were transferred into the autoclave. The autoclave was then heated up to 60° C. After stirring at 425 rpm for 19 hr and cooling to room temperature (approximately 23° C.), a pressure increase of approximately 24 psi was observed. Volatile components were cryotrapped in a stainless steel lecture bottle (SSLB) down to a pressure of 10 Torr. Analysis of the reactor contents by liquid injection Gas Chromatography-Mass Spectrometry (GC-MS) revealed a mixture of NH(SiH$_2$CH$_2$SiH$_3$)$_2$, N(SiH$_2$CH$_2$SiH$_3$)$_3$ and H$_3$Si(CH$_2$)SiH$_2$NHSiH$_2$(CH$_2$)SiH$_2$NHSiH$_2$(CH$_2$)SiH$_3$ that may be separated by distillation.

Herein, the product NH(SiH$_2$CH$_2$SiH$_3$)$_2$ may continue to react with CH$_2$(SiH$_3$)$_2$ under ammonia environment to form H$_3$Si(CH$_2$)SiH$_2$NHSiH$_2$(CH$_2$)SiH$_2$NHSiH$_2$(CH$_2$)SiH$_3$.

Example 3

Synthesis of N,N'-diisopropyl-N-((silylmethyl)silyl)acetimidamide [H$_3$SiCH$_2$SiH$_2$(N$^{iPr}$Me-amd) or (N$^{iPr}$Me-amd)H$_2$SiCH$_2$SiH$_2$(N$^{iPr}$Me-amd)]

The synthesis of N,N'-diisopropyl-N-((silylmethyl)silyl)acetimidamide is catalyzed by Ru on carbon and performed in a pressurized reactor by the reaction between disilapropane and N,N'-diisopropylacetimidamide.

A 0.3 L autoclave equipped with a mechanical stirrer, thermocouple, pressure gauge, pressure transducer and 3 metering valves was charged with 4.2 g (2.1 mmol of ruthenium) of 5% weight Ru on carbon catalyst in a glove box. The reactor was subsequently heated steadily under dynamic vacuum to 140° C. and held at this temperature for 4 hr. After cooling down to room temperature, the reactor was pressurized with helium (850 torr) whereupon N,N'- diisopropylacetimidamide (10 g, 0.07 mol)) was introduced in the glove box. After immersion of the reactor in a liquid nitrogen bath, atmospheric nitrogen was removed under vacuum and then 1,3-Disilapropane (14.7 g, 0.193 mol) was transferred to the reactor. The reactor was then steadily heated up to 110° C. After stirring at 426 rpm for 5 hr and cooling to room temperature, a pressure increase of approximately 25 psi was observed. Volatile components were cryotrapped in a SSLB down to a pressure of 55 Torr. Analysis of the reactor contents by liquid inject GC-MS revealed a 5:95 mixture of N,N'-diisopropyl-N-((silylmethyl)silyl)acetimidamide and N,N'-diisopropylacetimidamide that may be separated by distillation.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method for forming a SiN-containing film, the method comprising the steps of:
   delivering into a reactor containing a substrate a vapor including a Si-containing film forming composition comprising a Si—N containing precursor having the formula H$_3$Si(CH$_2$)$_n$SiH$_2$N(R)C(Me)=NR, RN=C(Me)N(R)SiH$_2$(CH$_2$)$_n$SiH$_2$N(R)C(Me)=NR,

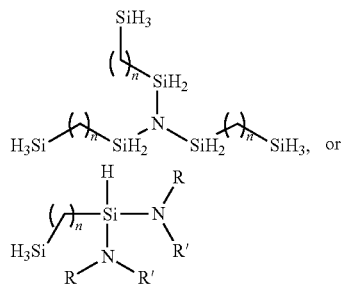

or wherein each R and R' may independently be H, a C$_1$ to C$_6$ alkyl group or a C$_3$-C$_{20}$ aryl, heterocycle or cycloalkyl group and n=1 or 2; and
   depositing at least part of the Si—N containing precursor onto the substrate to form the silicon-containing film on the substrate using a vapor deposition process.

2. The method of claim 1, wherein the vapor deposition process is selected from the group consisting of low pressure chemical vapor deposition (LPCVD), sub-atmospheric chemical vapor deposition (SACVD), plasma enhanced chemical vapor deposition (PECVD), flowable chemical vapor deposition (Flowable CVD), atomic layer deposition (ALD), plasma enhanced atomic layer deposition (PEALD), ultraviolet (UV) assisted ALD, catalyzed ALD, spatial isolation ALD.

3. The method of claim 1, further comprising the step of delivering into the reactor a reactant.

4. The method of claim 1, wherein the substrate is selected from the group consisting of a silicon wafer, a glass substrate, and a plastic substrate.

5. The method of claim 1, wherein the Si—N containing precursor is N(SiH$_2$(CH$_2$)$_n$SiH$_3$)$_3$, having the formula:

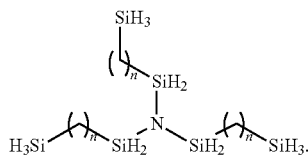

6. The method of claim 1, wherein the Si—N containing precursor is H$_3$Si(CH$_2$)$_n$SiH(NRR')$_2$, having the formula:

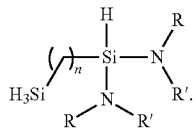

7. A process for forming a Si—N containing compound having the formula having the formula H$_3$Si(CH$_2$)$_n$SiH$_2$N(R)C(Me)=NR, RN=C(Me)N(R)SiH$_2$(CH$_2$)$_n$SiH$_2$N(R)C(Me)=NR,

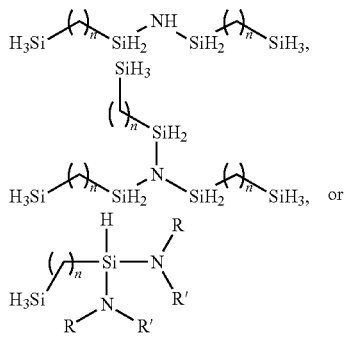

wherein R and R' may each independently be H, a C$_1$ to C$_6$ alkyl group, or a C$_3$-C$_{20}$ aryl, heterocycle or cycloalkyl group; and n=1 or 2, the process comprising the steps of:
   a) charging a catalyst into a reactor;
   b) introducing a first reactant having a Si—(CH$_2$)$_n$—Si backbone and a second reactant containing N into the reactor under inert atmosphere at a target temperature;
   c) maintaining contact between the first reactant, second reactants, and catalyst at the target temperature for a time period;
   d) evacuating a H$_2$ reaction product;
   e) separating the Si—N containing compound produced from the first and second reactants and any reaction products by distillation.

8. The process of claim 7, wherein the second reactant is selected from the group consisting of NH$_3$, RNH$_2$, R$_2$NH, and an amidine, wherein R may each independently be H, a C$_1$ to C$_6$ alkyl group, or a C$_3$-C$_{20}$ aryl, heterocycle or cycloalkyl group.

9. The process of claim 7, wherein the catalyst is a metal supported on carbon.

10. The process of claim 7, wherein the Si—N containing compound is $NH(SiH_2(CH_2)_nSiH_3)_2$, having the formula:
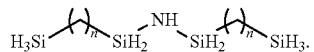
11. The process of claim 7, wherein the Si—N containing compound is $N(SiH_2(CH_2)_nSiH_3)_3$, having the formula:
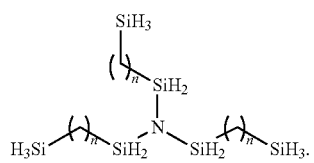
12. The process of claim 7, wherein the Si—N containing compound is $H_3Si(CH_2)_nSiH(NRR')_2$, having the formula:
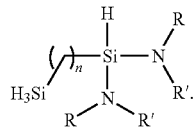
* * * * *